(12) United States Patent
Lee et al.

(10) Patent No.: US 10,745,270 B2
(45) Date of Patent: Aug. 18, 2020

(54) ACTUATOR LAYER PATTERNING WITH TOPOGRAPHY

(71) Applicant: InvenSense, Inc., San Jose, CA (US)

(72) Inventors: Daesung Lee, San Jose, CA (US); Dongyang Kang, San Jose, CA (US); Chienlu Chang, Los Altos, CA (US); Bongsang Kim, Mountain View, CA (US); Alan Cuthbertson, San Jose, CA (US)

(73) Assignee: InvenSense, Inc., San Jose, CA (US)

( * ) Notice: Subject to any disclaimer, the term of this patent is extended or adjusted under 35 U.S.C. 154(b) by 0 days.

(21) Appl. No.: 16/440,860

(22) Filed: Jun. 13, 2019

(65) Prior Publication Data

US 2020/0131031 A1 Apr. 30, 2020

Related U.S. Application Data

(60) Provisional application No. 62/752,948, filed on Oct. 30, 2018.

(51) Int. Cl.
*B81B 7/02* (2006.01)
*B81C 1/00* (2006.01)
*B81C 3/00* (2006.01)

(52) U.S. Cl.
CPC ............ *B81B 7/02* (2013.01); *B81C 1/00269* (2013.01); *B81C 1/00333* (2013.01); *B81C 1/00388* (2013.01); *B81C 1/00547* (2013.01); *B81C 3/001* (2013.01); *B81C 2201/0197* (2013.01); *B81C 2203/0118* (2013.01); *B81C 2203/03* (2013.01)

(58) Field of Classification Search
CPC ... B81B 7/02; B81C 1/00269; B81C 1/00388; B81C 1/00547; B81C 1/00333; B81C 3/001; B81C 2203/03; B81C 2203/0118; B81C 2201/0197
See application file for complete search history.

(56) References Cited

U.S. PATENT DOCUMENTS

| | | | |
|---|---|---|---|
| 2005/0170656 A1* | 8/2005 | Nasiri ................. | B81C 1/00238 438/700 |
| 2012/0094435 A1* | 4/2012 | Nasiri ................. | B81C 1/00238 438/107 |
| 2014/0077316 A1* | 3/2014 | Sparks ............... | B81C 1/00134 257/415 |
| 2018/0370790 A1* | 12/2018 | Cheng .................... | B81B 7/007 |

* cited by examiner

*Primary Examiner* — Anita K Alanko

(57) ABSTRACT

Provided herein is a method including fusion bonding a handle wafer to a first side of a device wafer. A hardmask is deposited on a second side of the device wafer, wherein the second side is planar. The hardmask is etched to form a MEMS device pattern and a standoff pattern. Standoffs are formed on the device wafer, wherein the standoffs are defined by the standoff pattern. A eutectic bond metal is deposited on the standoffs, the device wafer, and the hardmask. A first photoresist is deposited and removed, such that the first photoresist covers the standoffs. The eutectic bond metal is etched using the first photoresist. The MEMS device pattern is etched into the device wafer. The first photoresist and the hardmask are removed.

20 Claims, 29 Drawing Sheets

5300

```
┌─────────────────────────────────────────────────────────────┐
│ A HANDLE WAFER IS FUSION BONDED TO A FIRST SIDE OF A DEVICE │
│                            WAFER                            │
│                            5302                             │
└─────────────────────────────────────────────────────────────┘
                              │
┌─────────────────────────────────────────────────────────────┐
│ A HARDMASK IS DEPOSITED ON A SECOND SIDE OF THE DEVICE WAFER,│
│          WHEREIN THE SECOND SIDE IS PLANAR                  │
│                            5304                             │
└─────────────────────────────────────────────────────────────┘
                              │
┌─────────────────────────────────────────────────────────────┐
│  THE HARDMASK IS ETCHED TO FORM A MEMS DEVICE PATTERN AND A │
│                     STANDOFF PATTERN                        │
│                            5306                             │
└─────────────────────────────────────────────────────────────┘
                              │
┌─────────────────────────────────────────────────────────────┐
│   STANDOFFS ARE FORMED ON THE DEVICE WAFER, WHEREIN THE     │
│    STANDOFFS ARE DEFINED BY THE STANDOFF PATTERN            │
│                            5308                             │
└─────────────────────────────────────────────────────────────┘
                              │
┌─────────────────────────────────────────────────────────────┐
│  A EUTECTIC BOND METAL IS DEPOSITED ON THE STANDOFFS, THE   │
│             DEVICE WAFER, AND THE HARDMASK                  │
│                            5310                             │
└─────────────────────────────────────────────────────────────┘
                              │
┌─────────────────────────────────────────────────────────────┐
│  A FIRST PHOTORESIST IS DEPOSITED AND THE FIRST PHOTORESIST │
│  IS REMOVED SUCH THAT THE FIRST PHOTORESIST COVERS THE      │
│                         STANDOFFS                           │
│                            5312                             │
└─────────────────────────────────────────────────────────────┘
                              │
┌─────────────────────────────────────────────────────────────┐
│  THE EUTECTIC BOND METAL IS ETCHED USING THE FIRST PHOTORESIST│
│                            5314                             │
└─────────────────────────────────────────────────────────────┘
                              │
┌─────────────────────────────────────────────────────────────┐
│        THE MEMS DEVICE PATTERN IS ETCHED INTO THE DEVICE WAFER│
│                            5316                             │
└─────────────────────────────────────────────────────────────┘
                              │
┌─────────────────────────────────────────────────────────────┐
│   THE FIRST PHOTORESIST IS REMOVED AND THE HARDMASK IS REMOVED│
│                            5318                             │
└─────────────────────────────────────────────────────────────┘
```

```
┌─────────────────────────────────────────────────────────────┐
│ A HANDLE WAFER IS FUSION BONDED TO A FIRST SIDE OF A DEVICE │
│                           WAFER                             │
│                           5402                              │
└─────────────────────────────────────────────────────────────┘
                              │
┌─────────────────────────────────────────────────────────────┐
│ A HARDMASK IS DEPOSITED ON A SECOND SIDE OF THE DEVICE WAFER,│
│             WHEREIN THE SECOND SIDE IS PLANAR               │
│                           5404                              │
└─────────────────────────────────────────────────────────────┘
                              │
┌─────────────────────────────────────────────────────────────┐
│  THE HARDMASK IS ETCHED TO FORM A MEMS DEVICE PATTERN, A    │
│        STANDOFF PATTERN, AND A RECESS PATTERN               │
│                           5406                              │
└─────────────────────────────────────────────────────────────┘
                              │
┌─────────────────────────────────────────────────────────────┐
│  STANDOFFS ARE FORMED ON THE DEVICE WAFER, WHEREIN THE      │
│    STANDOFFS ARE DEFINED BY THE STANDOFF PATTERN            │
│                           5408                              │
└─────────────────────────────────────────────────────────────┘
                              │
┌─────────────────────────────────────────────────────────────┐
│ RECESSES ARE FORMED IN THE DEVICE WAFER, WHEREIN THE RECESSES│
│          ARE DEFINED BY THE RECESS PATTERN                  │
│                           5410                              │
└─────────────────────────────────────────────────────────────┘
                              │
┌─────────────────────────────────────────────────────────────┐
│  A EUTECTIC BOND METAL IS DEPOSITED ON THE DEVICE WAFER, THE│
│            STANDOFFS AND THE HARDMASK                       │
│                           5412                              │
└─────────────────────────────────────────────────────────────┘
                              │
┌─────────────────────────────────────────────────────────────┐
│ A FIRST PHOTORESIST IS DEPOSITED AND THE FIRST PHOTORESIST IS│
│   REMOVED SUCH THAT THE PHOTORESIST COVERS THE STANDOFFS    │
│                           5414                              │
└─────────────────────────────────────────────────────────────┘
                              │
┌─────────────────────────────────────────────────────────────┐
│ THE EUTECTIC BOND METAL IS ETCHED USING THE FIRST PHOTORESIST│
│         AND THE FIRST PHOTORESIST IS REMOVED                │
│                           5416                              │
└─────────────────────────────────────────────────────────────┘
                              │
                    ( CONTINUED IN FIG 54B )
```

```
CONTINUED FROM FIG 54A
        │
        ▼
```

A SECOND PHOTORESIST IS DEPOSITED AND REMOVED SUCH THAT THE SECOND PHOTORESIST COVERS THE STANDOFFS, THE EUTECTIC BOND METAL, AND THE RECESS PATTERN
5418

THE MEMS DEVICE PATTERN IS ETCHED INTO THE DEVICE WAFER
5420

THE SECOND PHOTORESIST IS REMOVED
5422

THE HARDMASK IS REMOVED
5424

FIG. 54B

ACTUATOR LAYER PATTERNING WITH TOPOGRAPHY

CROSS-REFERENCE TO RELATED APPLICATIONS

This application claims the benefit of U.S. Provisional Patent Application Ser. No. 62/752,948 filed Oct. 30, 2018, entitled "ACTUATOR LAYER PATTERNING WITH TOPOGRAPHY."

BACKGROUND

MEMS ("micro-electro-mechanical systems") are a class of devices that are fabricated using semiconductor-like processes and exhibit mechanical characteristics. For example, MEMS devices may include the ability to move or deform. In many cases, but not always, MEMS interact with electrical signals. A MEMS device may refer to a semiconductor device that is implemented as a micro-electro-mechanical system. A MEMS device includes mechanical elements and may optionally include electronics (e.g. electronics for sensing). MEMS devices include but are not limited to, for example, gyroscopes, accelerometers, magnetometers, pressure sensors, etc. As technology advances, it is desirable to reduce the size of the MEMS devices, thereby resulting in die size reduction.

SUMMARY

Provided herein is a method including fusion bonding a handle wafer to a first side of a device wafer. A hardmask is deposited on a second side of the device wafer, wherein the second side is planar. The hardmask is etched to form a MEMS device pattern and a standoff pattern. Standoffs are formed on the device wafer, wherein the standoffs are defined by the standoff pattern. A eutectic bond metal is deposited on the standoffs, the device wafer, and the hardmask. A first photoresist is deposited and removed, such that the first photoresist covers the standoffs. The eutectic bond metal is etched using the first photoresist. The MEMS device pattern is etched into the device wafer. The first photoresist and the hardmask are removed. These and other features and advantages will be apparent from a reading of the following detailed description.

BRIEF DESCRIPTION OF DRAWINGS

FIG. 53 shows an exemplary flow diagram for actuator layer patterning with topography according to one aspect of the present embodiments.

FIGS. 54A and 54B show another exemplary flow diagram for actuator layer patterning with topography according to one aspect of the present embodiments.

DESCRIPTION

Figure 1:
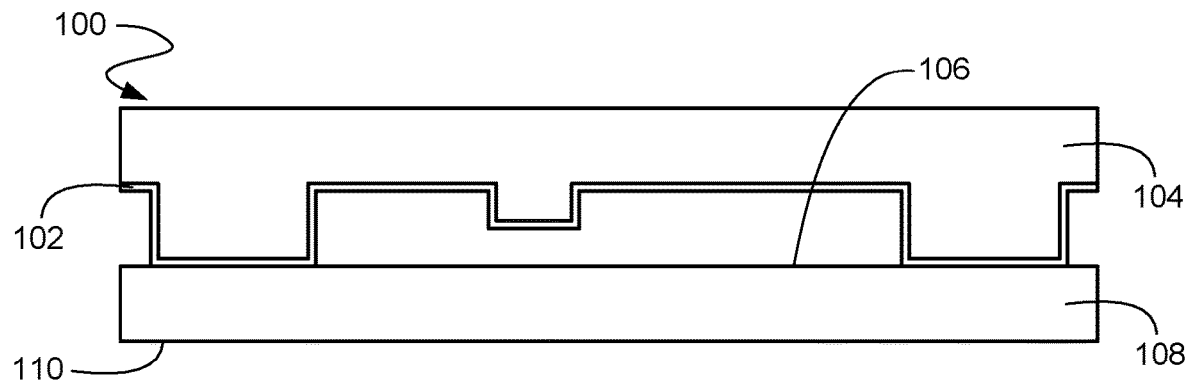
FIG. 1 shows a MEMS wafer at an early stage of manufacture according to one aspect of the present embodiments.

Before various embodiments are described in greater detail, it should be understood that the embodiments are not limiting, as elements in such embodiments may vary. It should likewise be understood that a particular embodiment described and/or illustrated herein has elements which may be readily separated from the particular embodiment and optionally combined with any of several other embodiments or substituted for elements in any of several other embodiments described herein.

It should also be understood that the terminology used herein is for the purpose of describing the certain concepts, and the terminology is not intended to be limiting. Unless defined otherwise, all technical and scientific terms used herein have the same meaning as commonly understood in the art to which the embodiments pertain.

Unless indicated otherwise, ordinal numbers (e.g., first, second, third, etc.) are used to distinguish or identify different elements or steps in a group of elements or steps, and do not supply a serial or numerical limitation on the elements or steps of the embodiments thereof. For example, "first," "second," and "third" elements or steps need not necessarily appear in that order, and the embodiments thereof need not necessarily be limited to three elements or steps. It should also be understood that, unless indicated otherwise, any labels such as "left," "right," "front," "back," "top," "middle," "bottom," "beside," "forward," "reverse," "overlying," "underlying," "up," "down," or other similar terms such as "upper," "lower," "above," "below," "under," "between," "over," "vertical," "horizontal," "proximal," "distal," and the like are used for convenience and are not intended to imply, for example, any particular fixed location, orientation, or direction. Instead, such labels are used to reflect, for example, relative location, orientation, or directions. It should also be understood that the singular forms of "a," "an," and "the" include plural references unless the context clearly dictates otherwise.

Terms such as "over," "overlying," "above," "under," etc. are understood to refer to elements that may be in direct contact or may have other elements in-between. For example, two layers may be in overlying contact, wherein one layer is over another layer and the two layers physically contact. In another example, two layers may be separated by one or more layers, wherein a first layer is over a second layer and one or more intermediate layers are between the first and second layers, such that the first and second layers do not physically contact.

The existence of standoffs in MEMS sensors causes non-uniform thicknesses of photoresist, leading to lithography variations. Previous solutions have focused on increasing the distance between standoffs and key MEMS features, however these solutions increase the die size. Other solutions have focused on reducing the standoff height, however these solutions have used larger standoffs on the bond pair, thereby increasing the processing complexity of corresponding complementary metal-oxide semiconductor ("CMOS") wafers.

Accordingly, embodiments described herein utilize a hard mask coated on the MEMS surface during fabrication in order to reduce the distance between standoffs and key MEMS features. In various embodiments, the hard mask is used to create a planar topography in order to reduce or prevent photoresist buildup around the standoffs. Therefore, etch processes form MEMS features much closer to the standoffs, thereby achieving size reductions and maintaining performance.

Referring now to FIG. 1, a MEMS wafer 100 at an early stage of manufacture is shown according to one aspect of the present embodiments. A fusion bond oxide 102 fusion bonds a handle silicon wafer 104 to a first side 106 of a device silicon wafer 108. A second side 110 of the device silicon wafer 108 is planar and opposite the first side 106.

Figure 2:
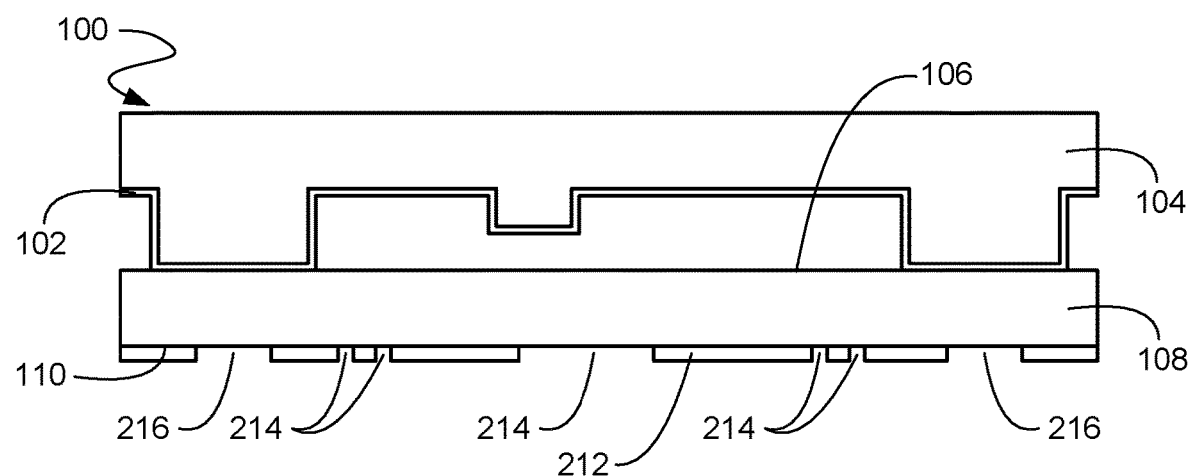
FIG. 2 shows the MEMS wafer after hardmask deposition according to one aspect of the present embodiments.

Referring now to FIG. 2, the MEMS wafer 100 after hardmask deposition is shown according to one aspect of the present embodiments. A hardmask 212 is deposited on the second side 110 of the device silicon wafer 108. In various embodiments the hardmask 212 includes oxide and is a different material than the device silicon wafer 108. The hardmask 212 is etched to form a MEMS device pattern 214 and a standoff pattern 216. The etching of the hardmask 212 etches the full thickness of the hardmask 212, thereby exposing portions of the device silicon wafer 108 in the MEMS device pattern 214 and the standoff pattern 216.

Figure 3:
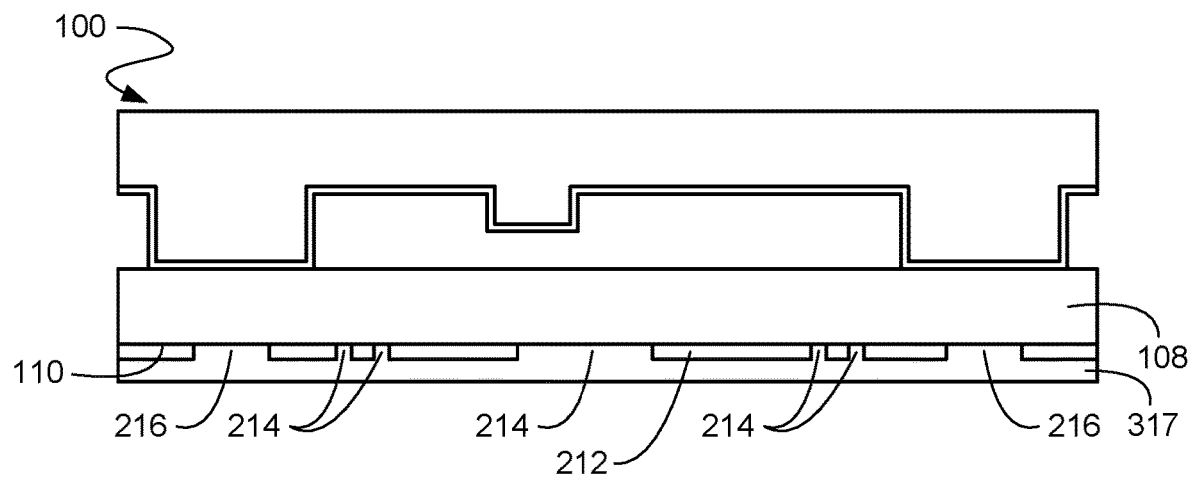
FIG. 3 shows the MEMS wafer after standoff layer deposition according to one aspect of the present embodiments.

Referring now to FIG. 3, the MEMS wafer 100 after standoff layer deposition is shown according to one aspect of the present embodiments. A standoff layer 317 is deposited over the hardmask 212 and the exposed portions of the device silicon wafer 108. In some embodiments, the standoff layer 317 is planarized (e.g. chemical-mechanical polishing of the surface of the standoff layer 317). The standoff layer 317 may include, for example, poly-silicon, epi-silicon, AlCu, or tungsten.

Figure 4:
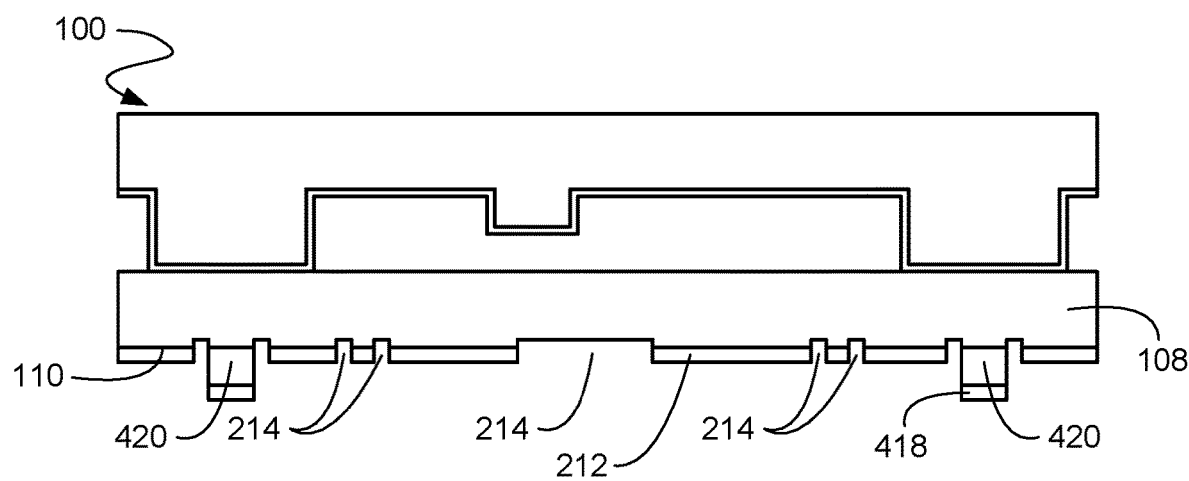
FIG. 4 shows the MEMS wafer after formation of standoffs according to one aspect of the present embodiments.

Referring now to FIG. 4, the MEMS wafer 100 after formation of standoffs is shown according to one aspect of the present embodiments. A photoresist 418 is deposited on the standoff layer 317. The photoresist 418 is a mask used during etching of the standoff layer 317. The etching forms standoffs 420, that are defined by the standoff pattern 216. In some embodiments, the etching also removes some of the exposed portions of the device silicon wafer 108 in the MEMS device pattern 214 and around the standoffs 420 in the standoff pattern 216. After etching, the photoresist 418 is removed.

Figure 5:
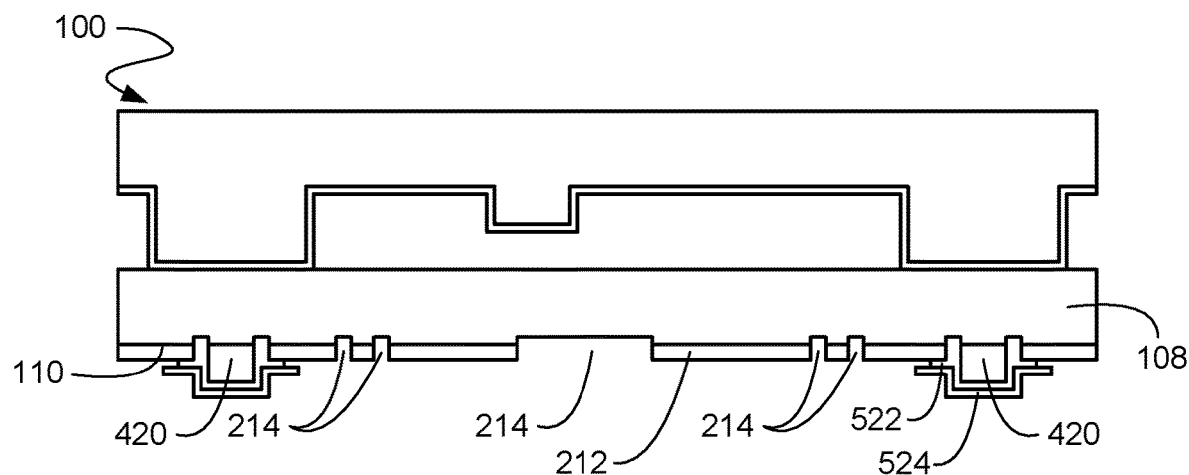
FIG. 5 shows the MEMS wafer after deposition of a eutectic bond metal on the standoffs according to one aspect of the present embodiments.

Referring now to FIG. 5, the MEMS wafer 100 after deposition of a eutectic bond metal on the standoffs 420 is shown according to one aspect of the present embodiments. A eutectic bond metal 522 (e.g. germanium, aluminum, etc.) has been deposited (e.g. sputtered) onto the second side 110 of the device silicon wafer 108, including the standoffs 420, the hardmask 212, and the exposed portions of the device silicon wafer 108 in the MEMS device pattern 214. Another photoresist 524 is deposited on the eutectic bond metal 522 and then removed, leaving only the photoresist 524 covering the standoffs 420 and the eutectic bond metal 522 on the standoffs 420. The eutectic bond metal 522 is then etched using the photoresist 524. The etching removes the eutectic bond metal 522 from the hardmask 212 and the exposed portions of the device silicon wafer 108 in the MEMS device pattern 214, leaving the eutectic bond metal 522 covering the standoffs 420.

Figure 6:
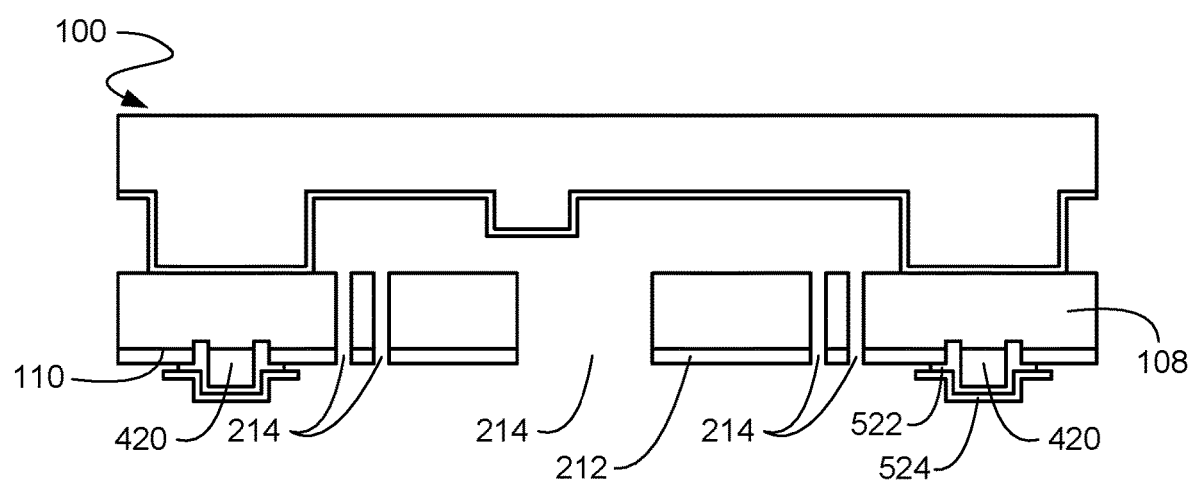
FIG. 6 shows the MEMS wafer after device layer etch according to one aspect of the present embodiments.

Referring now to FIG. 6, the MEMS wafer 100 after device layer etch is shown according to one aspect of the present embodiments. The MEMS device pattern 214 (defined by the hardmask 212) is etched into the device silicon wafer 108. During the etching the photoresist 524 protects the eutectic bond metal 522.

Figure 7:
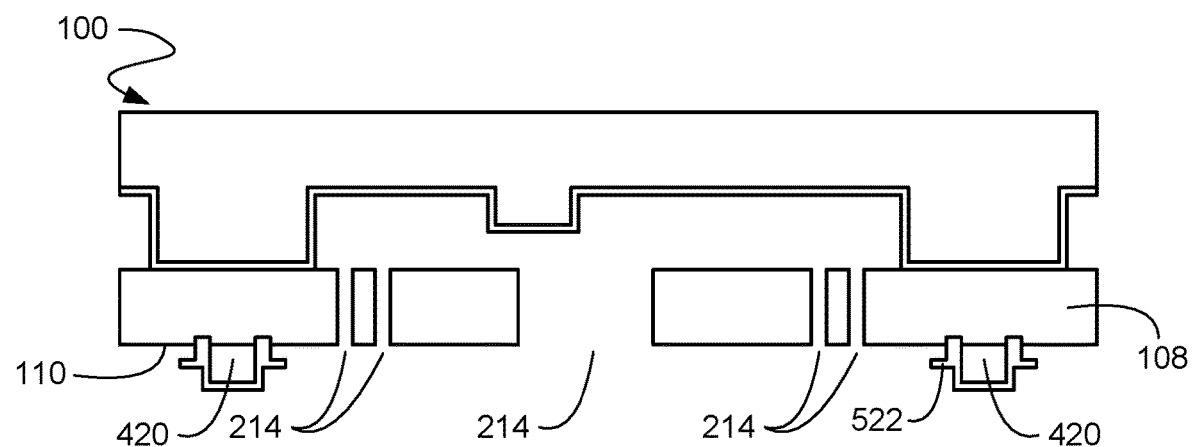
FIG. 7 shows the MEMS wafer ready for bonding with a CMOS wafer according to one aspect of the present embodiments.

Referring now to FIG. 7, the MEMS wafer 100 ready for bonding with a CMOS wafer is shown according to one aspect of the present embodiments. The photoresist 524 has been removed (e.g. stripped). In addition, the hardmask 212 has been removed (e.g. etched), leaving the device silicon wafer 108 and the standoffs 420 with the eutectic bond metal 522. In further steps (not shown), the standoffs 420 of the MEMS wafer 100 are eutecticly bonded to a CMOS wafer with eutectic bonds. In various embodiments, the eutectic bond metal 522 (e.g. germanium) on the standoffs 420 may form the eutectic bonds with another eutectic bond metal (e.g. aluminum) on the CMOS wafer.

Figure 8:
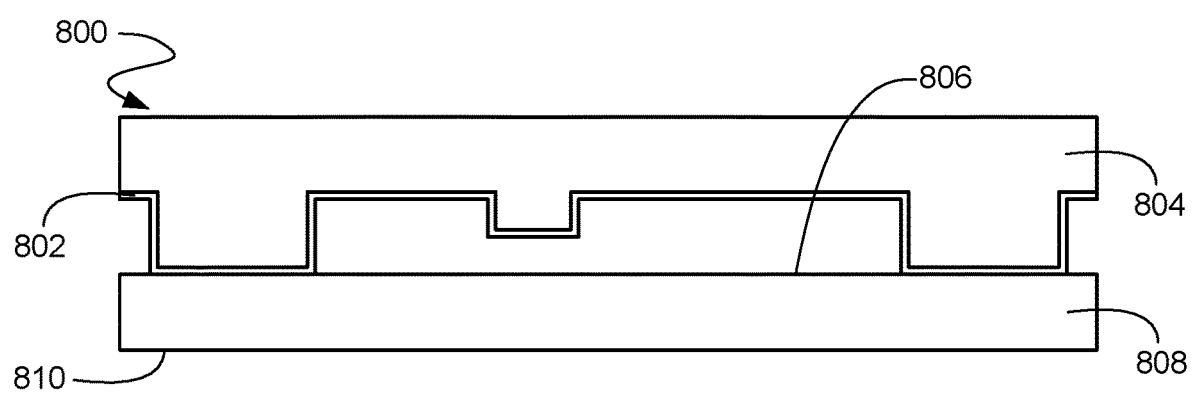
FIG. 8 shows another MEMS wafer at an early stage of manufacture according to one aspect of the present embodiments.

Referring now to FIG. 8, another MEMS wafer 800 at an early stage of manufacture is shown according to one aspect of the present embodiments. A fusion bond oxide 802 fusion bonds a handle silicon wafer 804 to a first side 806 of a device silicon wafer 808. A second side 810 of the device silicon wafer 808 is planar and opposite the first side 806.

Figure 9:
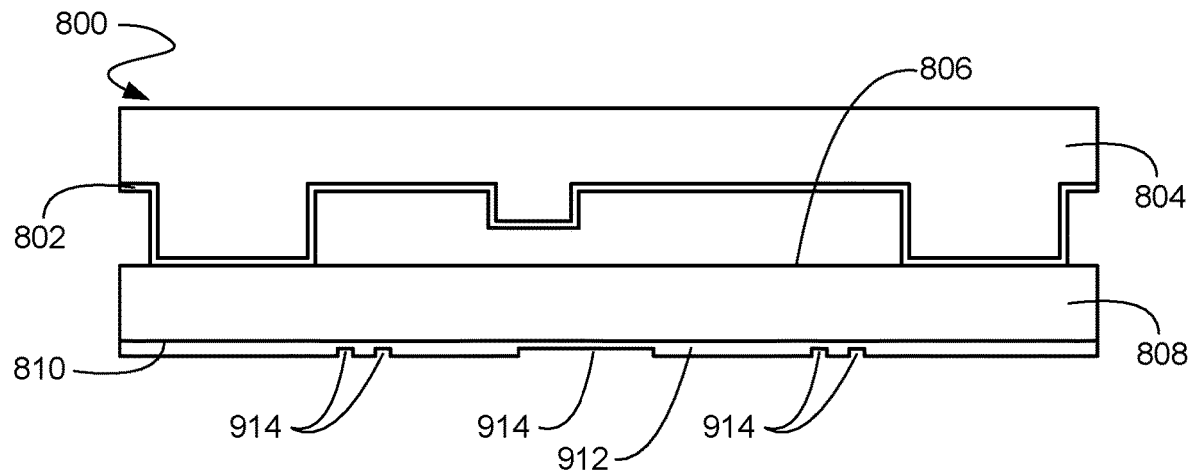
FIG. 9 shows the MEMS wafer after hardmask deposition according to one aspect of the present embodiments.

Referring now to FIG. 9, the MEMS wafer 800 after hardmask deposition is shown according to one aspect of the present embodiments. A hardmask 912 is deposited on the second side 810 of the device silicon wafer 808. In various embodiments the hardmask 912 includes oxide and is a different material than the device silicon wafer 808. The hardmask 912 is etched to form a MEMS device pattern 914. The etching of the hardmask 912 etches a partial thickness of the hardmask 912. As such, the etching stops before reaching the device silicon wafer 808, thereby leaving the second side 810 of the device silicon wafer 808 covered by the hardmask 912.

Figure 10:
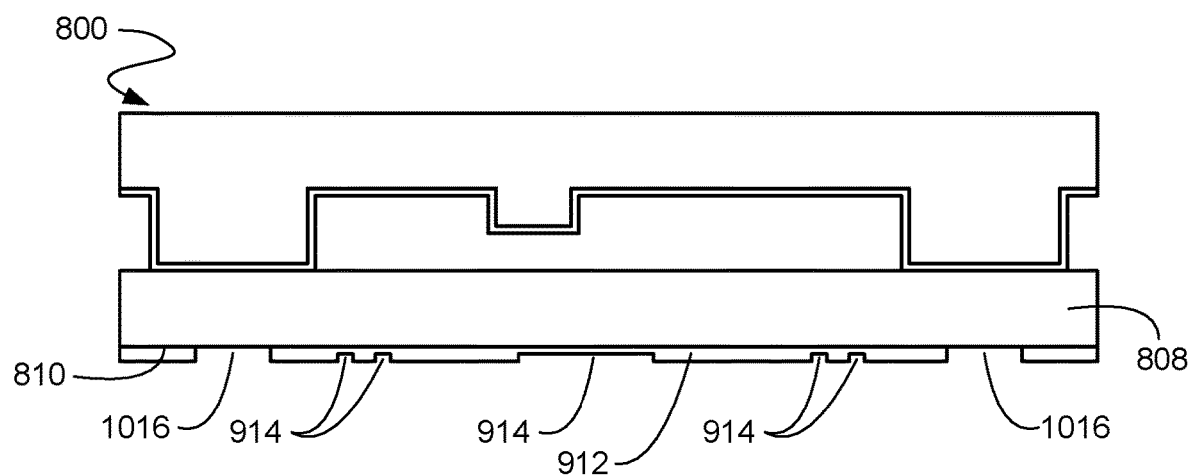
FIG. 10 shows the MEMS wafer after formation of a standoff pattern according to one aspect of the present embodiments.

Referring now to FIG. 10, the MEMS wafer 800 after formation of a standoff pattern is shown according to one aspect of the present embodiments. The hardmask 912 is etched to form a standoff pattern 1016. The etching of the standoff pattern 1016 into the hardmask 912 etches the full thickness of the hardmask 912, thereby exposing portions of the device silicon wafer 808 in the standoff pattern 1016. As such, the etching of the standoff pattern 1016 reaches the device silicon wafer 808. On the other hand, the MEMS device pattern 914 remains partially etched at this point, and the portions of the device silicon wafer 808 in the MEMS device pattern 914 remain covered by the hardmask 912.

Figure 11:
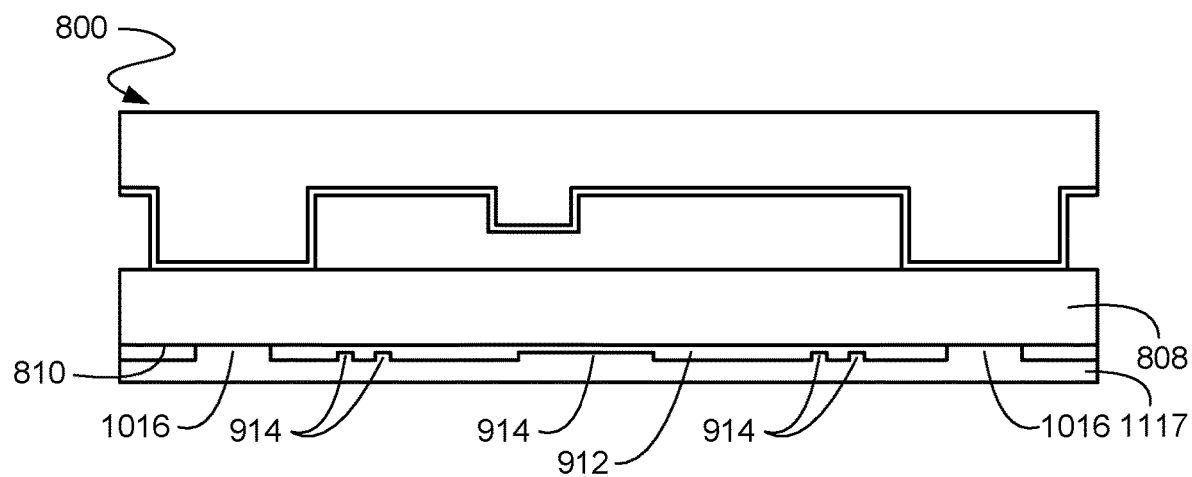
FIG. 11 shows the MEMS wafer after standoff layer deposition according to one aspect of the present embodiments.

Referring now to FIG. 11, the MEMS wafer 800 after standoff layer deposition is shown according to one aspect of the present embodiments. A standoff layer 1117 is deposited over the hardmask 912 and the exposed portions of the device silicon wafer 808. In some embodiments, the standoff layer 1117 is planarized (e.g. chemical-mechanical polishing of the surface of the standoff layer 1117). The standoff layer 1117 may include, for example, poly-silicon, epi-silicon, AlCu, or tungsten.

Figure 12:
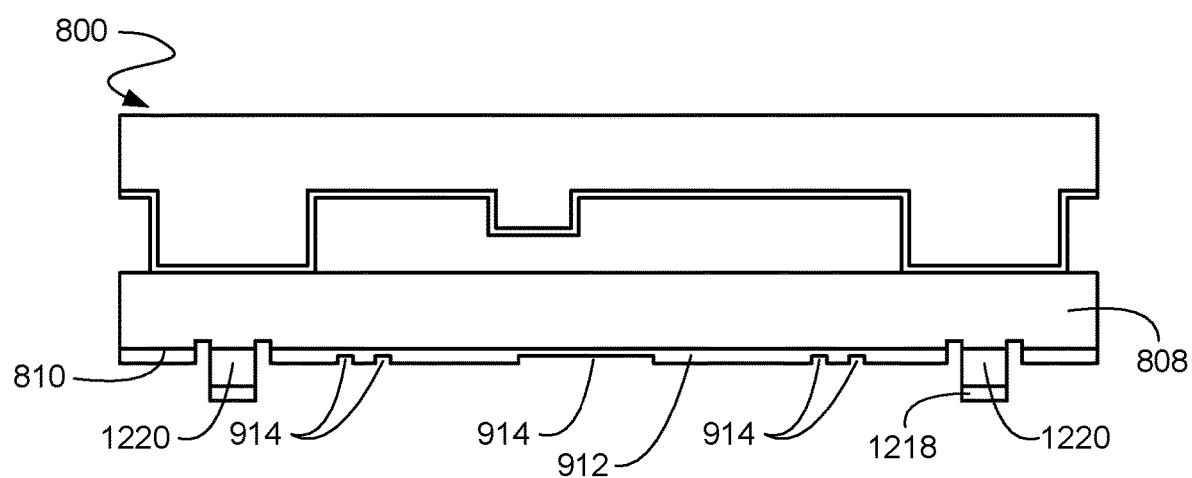
FIG. 12 shows the MEMS wafer after formation of standoffs according to one aspect of the present embodiments.

Referring now to FIG. 12, the MEMS wafer 800 after formation of standoffs is shown according to one aspect of the present embodiments. A photoresist 1218 is deposited on the standoff layer 1117. The photoresist 1218 is a mask used during etching of the standoff layer 1117. The etching forms standoffs 1220, that are defined by the standoff pattern 1016. In some embodiments, the etching also removes some of the exposed portions of the device silicon wafer 808 around the standoffs 1220 in the standoff pattern 1016. However, the portions of the device silicon wafer 808 in the MEMS device pattern 914 that remain covered by the hardmask 912 are protected from the etch, and do not suffer from etch-loss.

Figure 13:
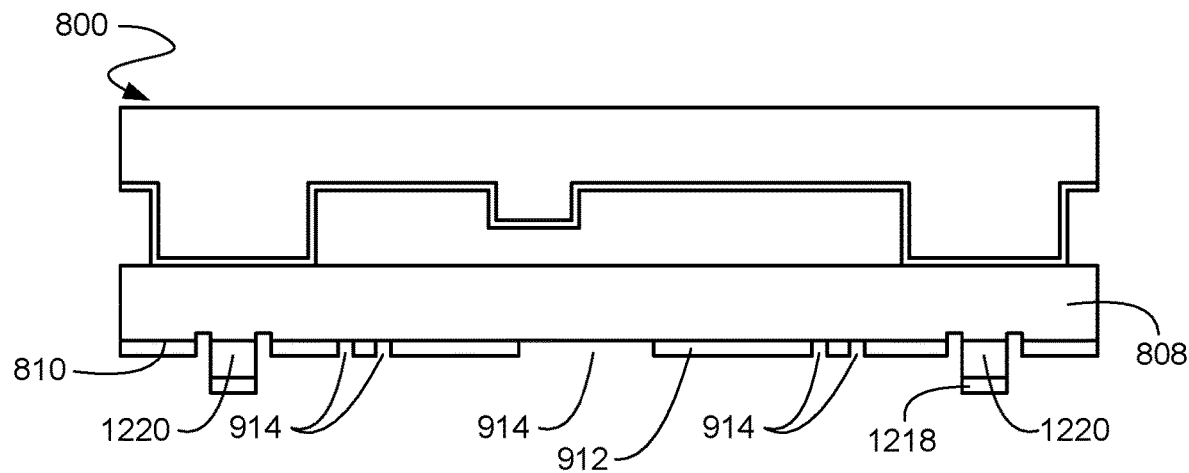
FIG. 13 shows the MEMS wafer after further etching of the MEMS device pattern according to one aspect of the present embodiments.

Referring now to FIG. 13, the MEMS wafer 800 after further etching of the MEMS device pattern 914 is shown according to one aspect of the present embodiments. After formation of the standoffs 1220, the MEMS device pattern 914 is further etched into the hardmask 912. The further etching of the MEMS device pattern 914 reaches the device silicon wafer 808, thereby exposing portions of the device silicon wafer 808 in the MEMS device pattern 914. After etching, the photoresist 1218 is removed.

Figure 14:
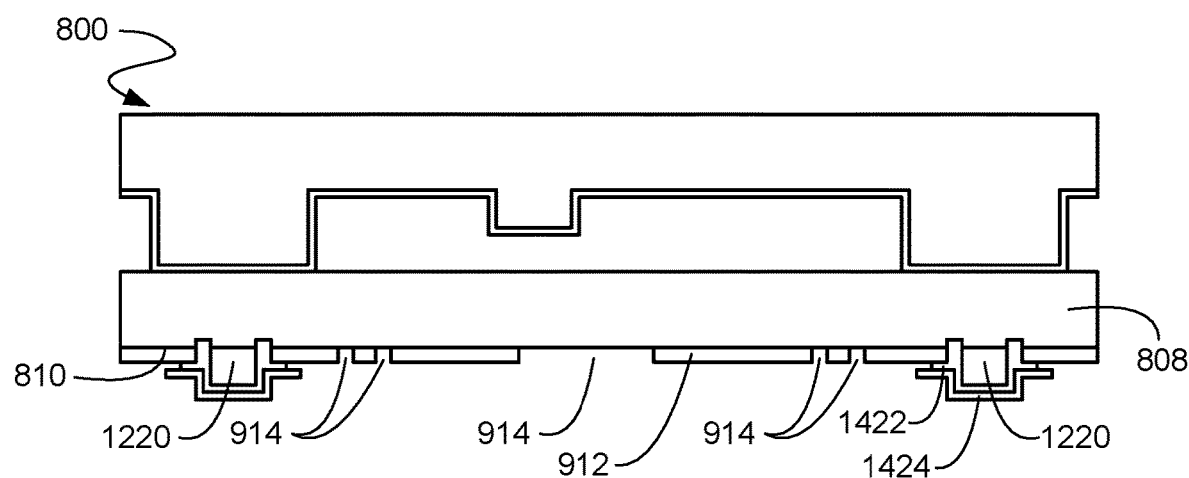
FIG. 14 shows the MEMS wafer after deposition of a eutectic bond metal on the standoffs according to one aspect of the present embodiments.

Referring now to FIG. 14, the MEMS wafer 800 after deposition of a eutectic bond metal on the standoffs 1220 is shown according to one aspect of the present embodiments. A eutectic bond metal 1422 (e.g. germanium, aluminum, etc.) has been deposited (e.g. sputtered) onto the second side 810 of the device silicon wafer 808, including the standoffs 1220, the hardmask 912, and the exposed portions of the device silicon wafer 808 in the MEMS device pattern 914. Another photoresist 1424 is deposited on the eutectic bond metal 1422 and then removed, leaving only the photoresist 1424 covering the standoffs 1220 and the eutectic bond metal 1422 on the standoffs 1220. The eutectic bond metal 1422 is then etched using the photoresist 1424. The etching removes the eutectic bond metal 1422 from the hardmask 912 and the exposed portions of the device silicon wafer 808 in the MEMS device pattern 914, leaving the eutectic bond metal 1422 covering the standoffs 1220.

Figure 15:
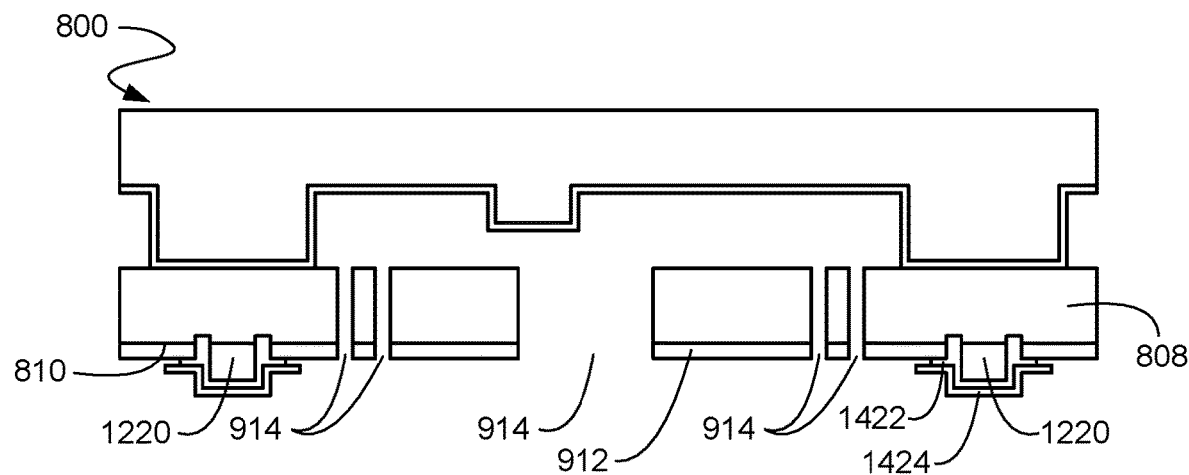
FIG. 15 shows the MEMS wafer after device layer etch according to one aspect of the present embodiments.

Referring now to FIG. 15, the MEMS wafer 800 after device layer etch is shown according to one aspect of the present embodiments. The MEMS device pattern 914 (defined by the hardmask 912) is etched into the device silicon wafer 808. During the etching the photoresist 1424 protects the eutectic bond metal 1422.

Figure 16:
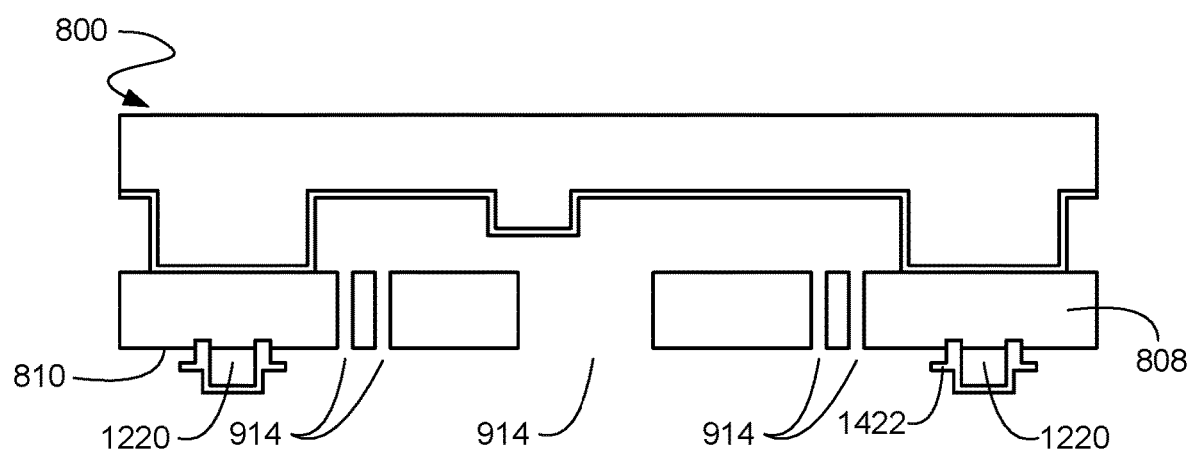
FIG. 16 shows the MEMS wafer ready for bonding with a CMOS wafer according to one aspect of the present embodiments.

Referring now to FIG. 16, the MEMS wafer 800 ready for bonding with a CMOS wafer is shown according to one aspect of the present embodiments. The photoresist 1424 has been removed (e.g. stripped). In addition, the hardmask 912 has been removed (e.g. etched), leaving the device silicon wafer 808 and the standoffs 1220 with the eutectic bond metal 1422. In further steps (not shown), the standoffs 1220 of the MEMS wafer 800 are eutecticly bonded to a CMOS wafer with eutectic bonds. In various embodiments, the eutectic bond metal 1422 (e.g. germanium) on the standoffs 1220 may form the eutectic bonds with another eutectic bond metal (e.g. aluminum) on the CMOS wafer.

Figure 17:
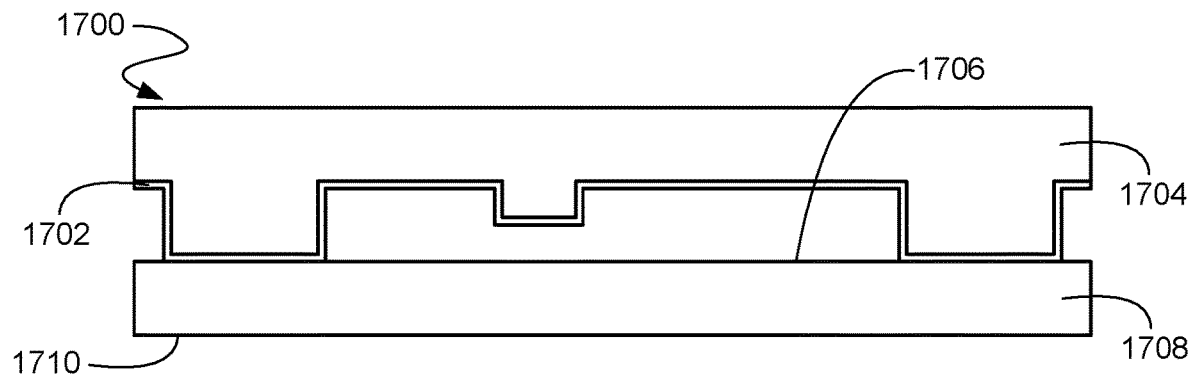
FIG. 17 shows another MEMS wafer at an early stage of manufacture according to one aspect of the present embodiments.

Referring now to FIG. 17, another MEMS wafer 1700 at an early stage of manufacture is shown according to one aspect of the present embodiments. A fusion bond oxide 1702 fusion bonds a handle silicon wafer 1704 to a first side 1706 of a device silicon wafer 1708. A second side 1710 of the device silicon wafer 1708 is planar and opposite the first side 1706.

Figure 18:
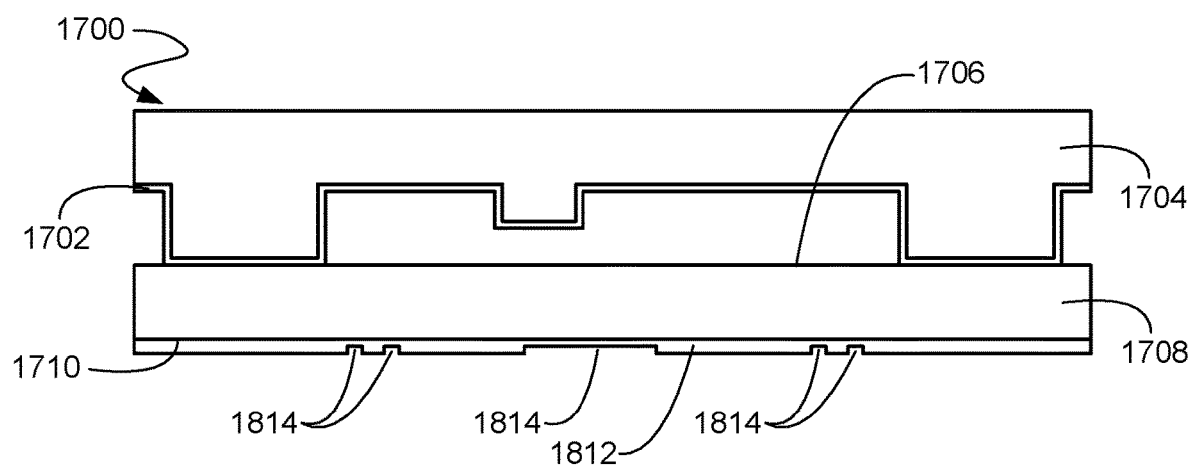
FIG. 18 shows the MEMS wafer after hardmask deposition according to one aspect of the present embodiments.

Referring now to FIG. 18, the MEMS wafer 1700 after hardmask deposition is shown according to one aspect of the present embodiments. A hardmask 1812 is deposited on the second side 1710 of the device silicon wafer 1708. In various embodiments the hardmask 1812 includes oxide and is a different material than the device silicon wafer 1708. The hardmask 1812 is etched to form a MEMS device pattern 1814. The etching of the hardmask 1812 etches a partial thickness of the hardmask 1812. As such, the etching stops before reaching the device silicon wafer 1708, thereby leaving the second side 1710 of the device silicon wafer 1708 covered by the hardmask 1812.

Figure 19:
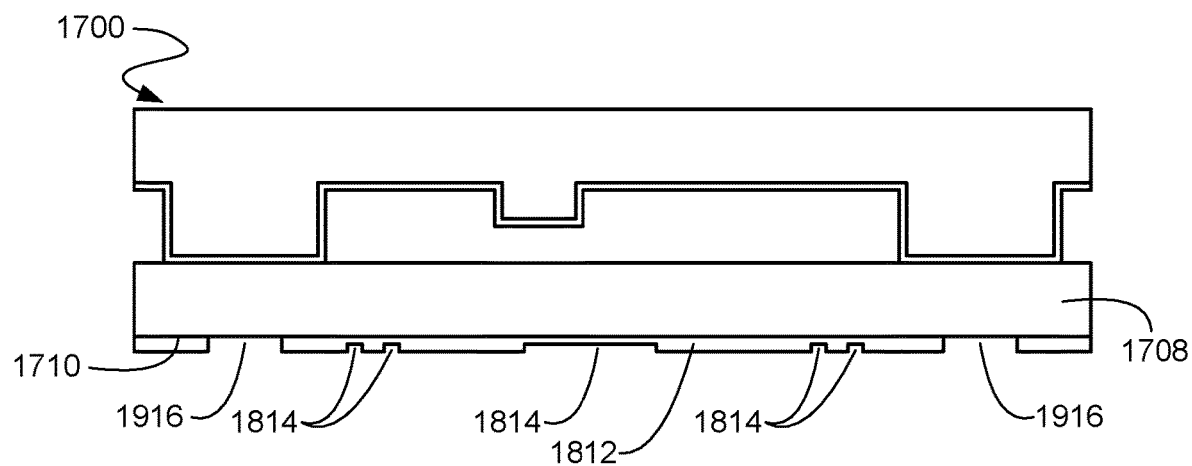
FIG. 19 shows the MEMS wafer after formation of a standoff pattern according to one aspect of the present embodiments.

Referring now to FIG. 19, the MEMS wafer 1700 after formation of a standoff pattern is shown according to one aspect of the present embodiments. The hardmask 1812 is etched to form a standoff pattern 1916. The etching of the standoff pattern 1916 into the hardmask 1812 etches the full thickness of the hardmask 1812, thereby exposing portions of the device silicon wafer 1708 in the standoff pattern 1916. As such, the etching of the standoff pattern 1916 reaches the device silicon wafer 1708. On the other hand, the MEMS device pattern 1814 remains partially etched at this point, and the portions of the device silicon wafer 1708 in the MEMS device pattern 1814 remain covered by the hardmask 1812.

Figure 20:
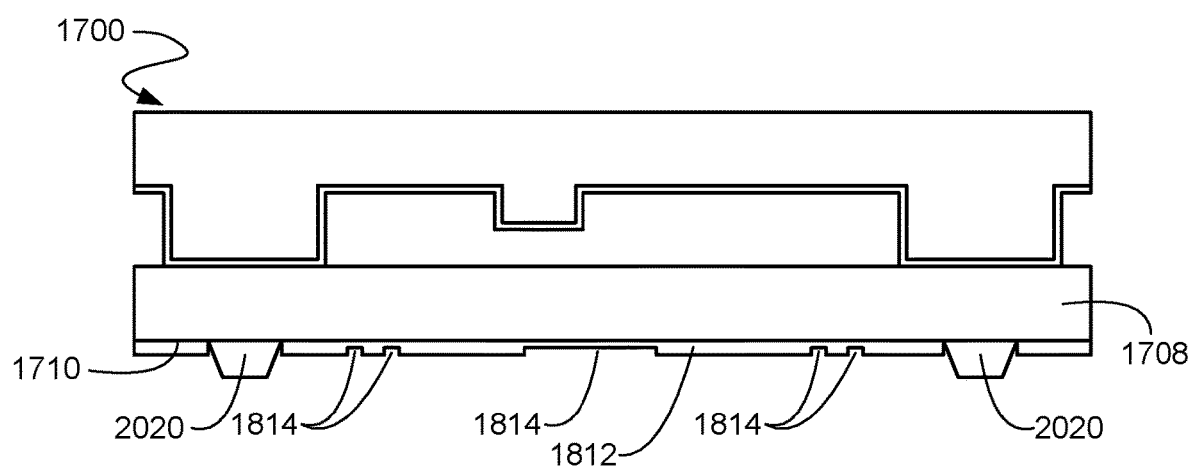
FIG. 20 shows the MEMS wafer after formation of standoffs according to one aspect of the present embodiments.

Referring now to FIG. 20, the MEMS wafer 1700 after formation of standoffs is shown according to one aspect of the present embodiments. Standoffs 1220 are grown on the exposed portions of the device silicon wafer 1708 that are defined by the standoff pattern 1916. For example, epi-silicon is grown on contact with the device silicon wafer 1708 in the openings defined by the standoff pattern 1916. As such, the standoffs 1220 are grown on the device silicon wafer 1708 in the standoff pattern 1916. However, the portions of the device silicon wafer 1708 in the MEMS device pattern 1814 that remain covered by the hardmask 1812 are protected from growth and remain clear.

Figure 21:
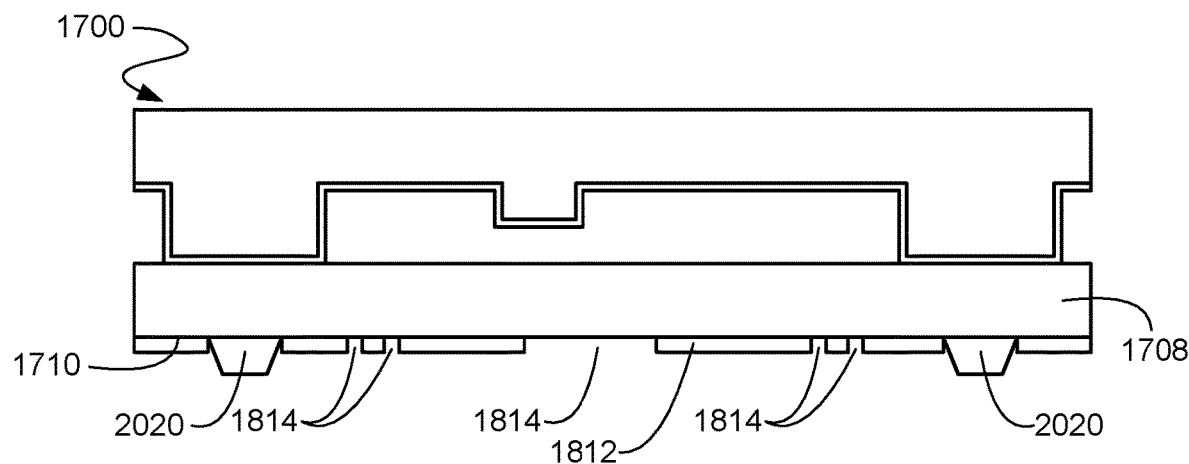
FIG. 21 shows the MEMS wafer after further etching of the MEMS device pattern according to one aspect of the present embodiments.

Referring now to FIG. 21, the MEMS wafer 1700 after further etching of the MEMS device pattern 1814 is shown according to one aspect of the present embodiments. After formation of the standoffs 2020, the MEMS device pattern 1814 is further etched into the hardmask 1812. The further etching of the MEMS device pattern 1814 reaches the device silicon wafer 1708, thereby exposing portions of the device silicon wafer 1708 in the MEMS device pattern 1814.

Figure 22:
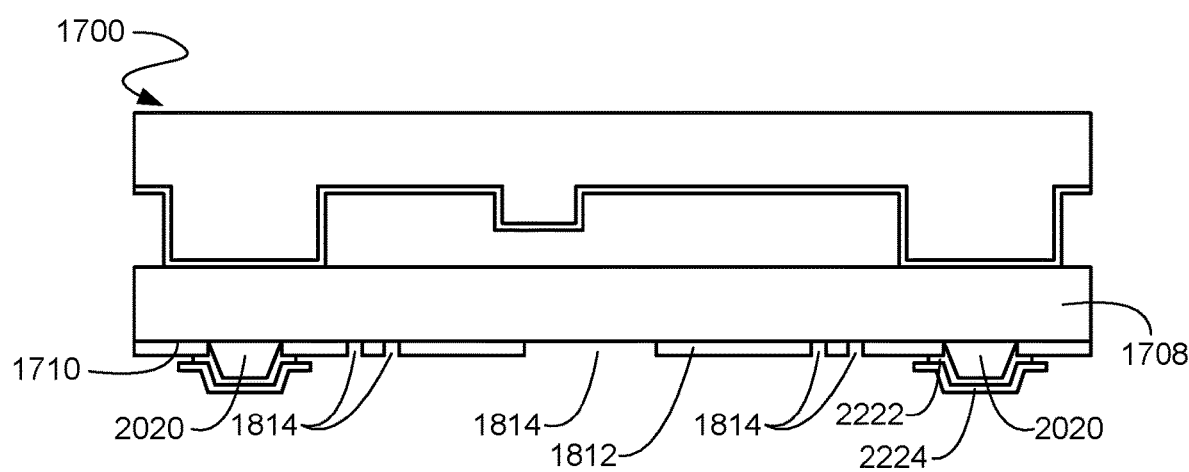
FIG. 22 shows the MEMS wafer after deposition of a eutectic bond metal on the standoffs according to one aspect of the present embodiments.

Referring now to FIG. 22, the MEMS wafer 1700 after deposition of a eutectic bond metal on the standoffs 2020 is shown according to one aspect of the present embodiments. A eutectic bond metal 2222 (e.g. germanium, aluminum, etc.) has been deposited (e.g. sputtered) onto the second side 1710 of the device silicon wafer 1708, including the standoffs 2020, the hardmask 1812, and the exposed portions of the device silicon wafer 1708 in the MEMS device pattern 1814. A photoresist 2224 is deposited on the eutectic bond metal 2222 and then removed, leaving only the photoresist 2224 covering the standoffs 2020 and the eutectic bond metal 2222 on the standoffs 2020. The eutectic bond metal 2222 is then etched using the photoresist 2224. The etching removes the eutectic bond metal 2222 from the hardmask 1812 and the exposed portions of the device silicon wafer 1708 in the MEMS device pattern 1814, leaving the eutectic bond metal 2222 covering the standoffs 2020.

Figure 23:
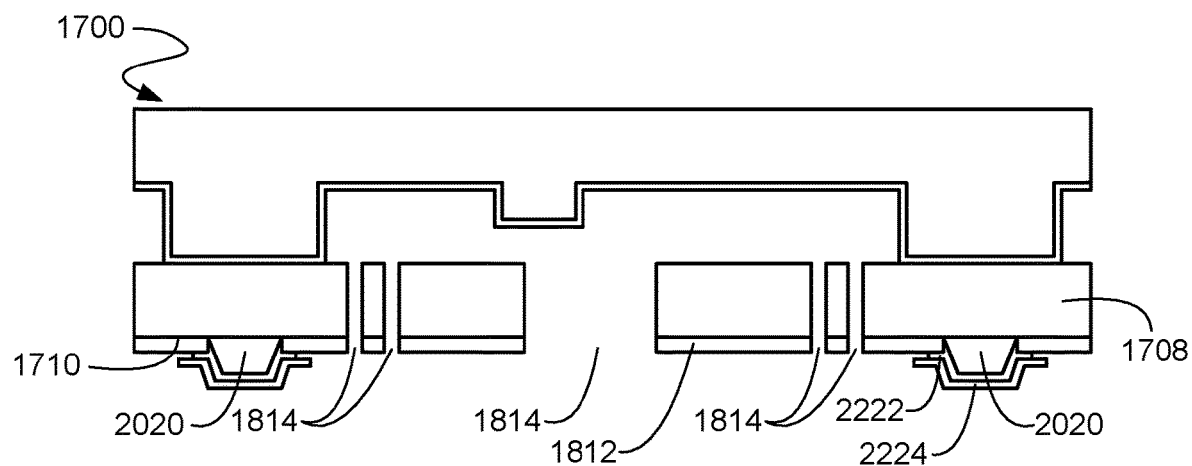
FIG. 23 shows the MEMS wafer after device layer etch according to one aspect of the present embodiments.

Referring now to FIG. 23, the MEMS wafer 1700 after device layer etch is shown according to one aspect of the present embodiments. The MEMS device pattern 1814 (defined by the hardmask 1812) is etched into the device silicon wafer 1708. During the etching the photoresist 2224 protects the eutectic bond metal 2222.

Figure 24:
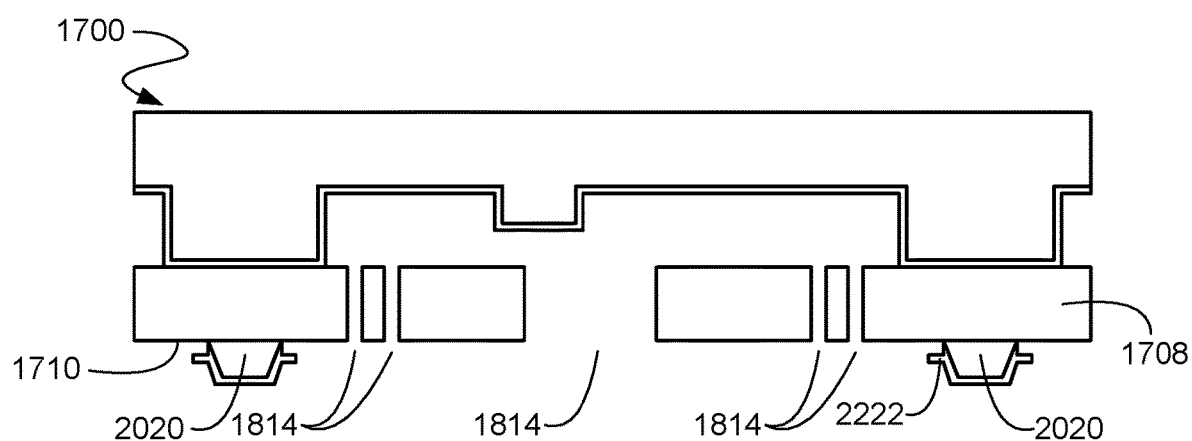
FIG. 24 shows the MEMS wafer ready for bonding with a CMOS wafer according to one aspect of the present embodiments.

Referring now to FIG. 24, the MEMS wafer 1700 ready for bonding with a CMOS wafer is shown according to one aspect of the present embodiments. The photoresist 2224 has been removed (e.g. stripped). In addition, the hardmask 1812 has been removed (e.g. etched), leaving the device silicon wafer 1708 and the standoffs 2020 with the eutectic bond metal 2222. In further steps (not shown), the standoffs 2020 of the MEMS wafer 1700 are eutecticly bonded to a CMOS wafer with eutectic bonds. In various embodiments, the eutectic bond metal 2222 (e.g. germanium) on the standoffs 2020 may form the eutectic bonds with another eutectic bond metal (e.g. aluminum) on the CMOS wafer.

Figure 25:
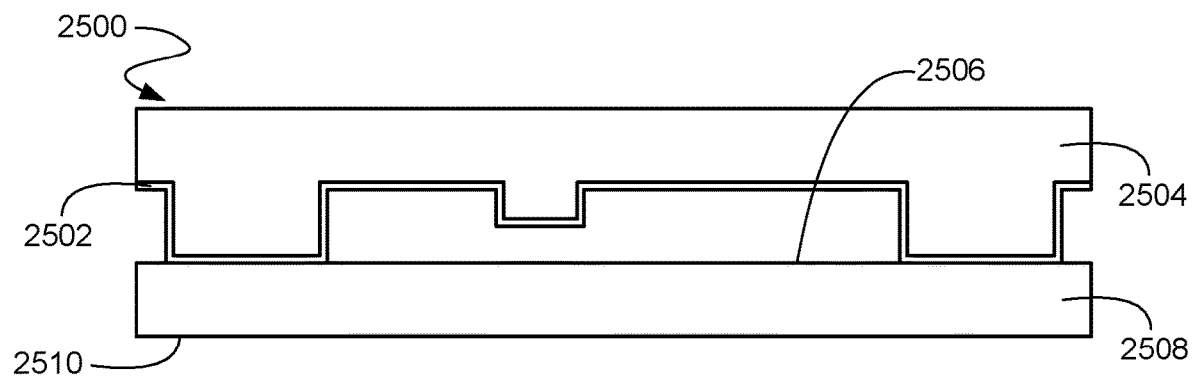
FIG. 25 shows another MEMS wafer at an early stage of manufacture according to one aspect of the present embodiments.

Referring now to FIG. 25, another MEMS wafer 2500 at an early stage of manufacture is shown according to one aspect of the present embodiments. A fusion bond oxide 2502 fusion bonds a handle silicon wafer 2504 to a first side 2506 of a device silicon wafer 2508. A second side 2510 of the device silicon wafer 2508 is planar and opposite the first side 2506.

Figure 26:
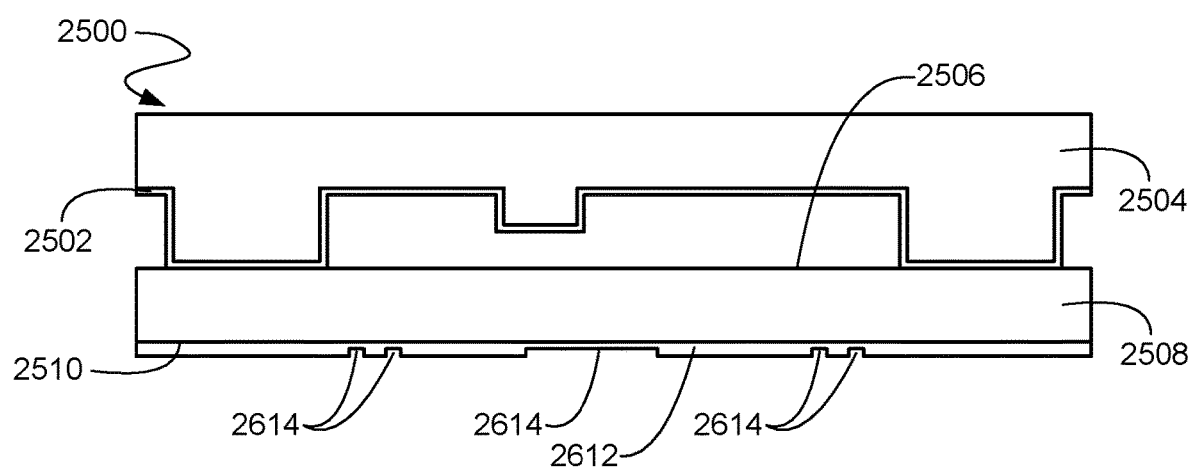
FIG. 26 shows the MEMS wafer after hardmask deposition according to one aspect of the present embodiments.

Referring now to FIG. 26, the MEMS wafer 2500 after hardmask deposition is shown according to one aspect of the present embodiments. A hardmask 2612 is deposited on the second side 2510 of the device silicon wafer 2508. In various embodiments the hardmask 2612 includes oxide and is a different material than the device silicon wafer 2508. The hardmask 2612 is etched to form a MEMS device pattern 2614. The etching of the hardmask 2612 etches a partial thickness of the hardmask 2612. As such, the etching stops before reaching the device silicon wafer 2508, thereby leaving the second side 2510 of the device silicon wafer 2508 covered by the hardmask 2612.

Figure 27:
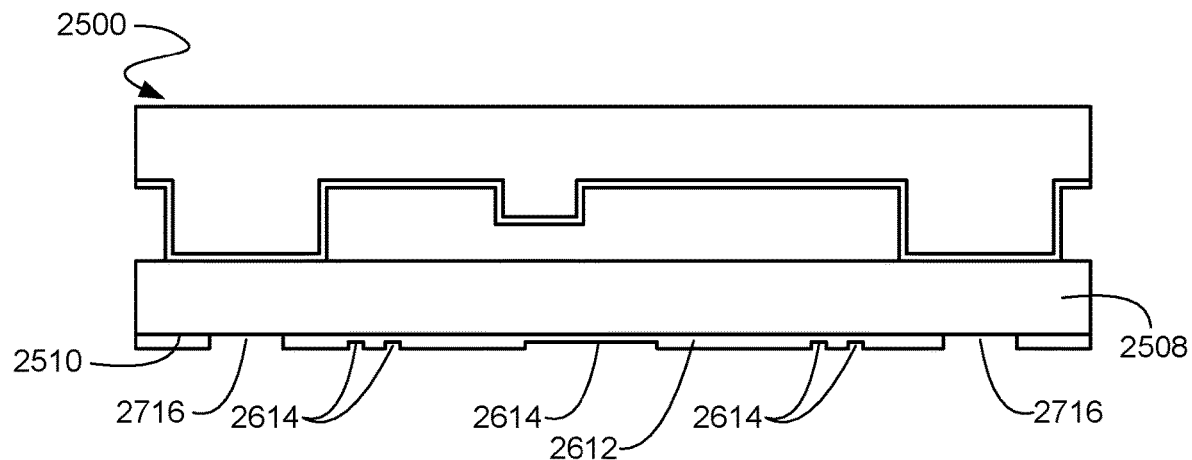
FIG. 27 shows the MEMS wafer after formation of a standoff pattern according to one aspect of the present embodiments.

Referring now to FIG. 27, the MEMS wafer 2500 after formation of a standoff pattern is shown according to one aspect of the present embodiments. The hardmask 2612 is etched to form a standoff pattern 2716. The etching of the standoff pattern 2716 into the hardmask 2612 etches the full thickness of the hardmask 2612, thereby exposing portions of the device silicon wafer 2508 in the standoff pattern 2716. As such, the etching of the standoff pattern 2716 reaches the device silicon wafer 2508. On the other hand, the MEMS device pattern 2614 remains partially etched at this point, and the portions of the device silicon wafer 2508 in the MEMS device pattern 2614 remain covered by the hardmask 2612.

Figure 28:
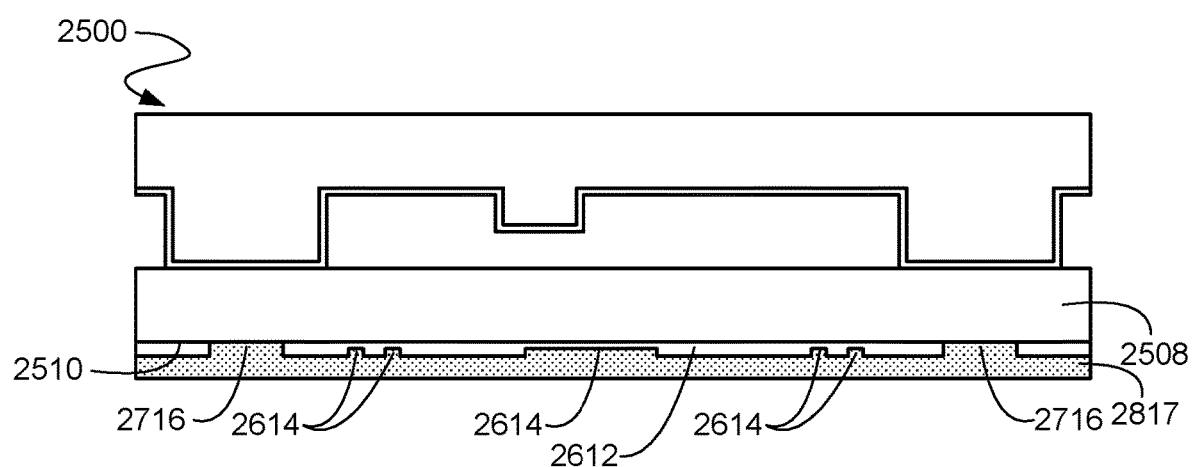
FIG. 28 shows the MEMS wafer after sacrificial layer deposition according to one aspect of the present embodiments.

Referring now to FIG. 28, the MEMS wafer 2500 after sacrificial layer deposition is shown according to one aspect of the present embodiments. A sacrificial layer 2817 is deposited over the hardmask 2612 and the exposed portions of the device silicon wafer 2508. The sacrificial layer 2817 may include, for example, poly-silicon or amorphous silicon (e.g. a-silicon) and is a different material than the hardmask 2612.

Figure 29:
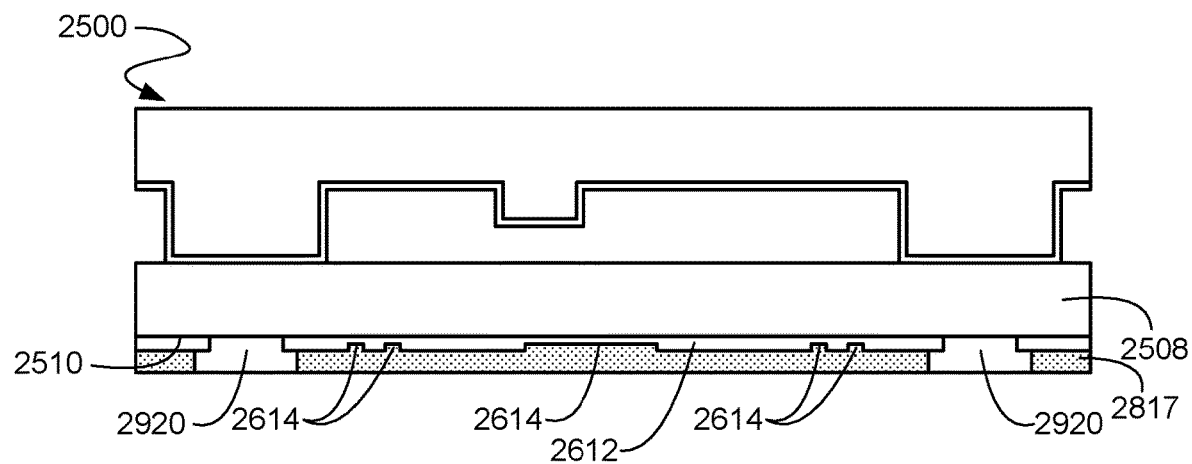
FIG. 29 shows the MEMS wafer after formation of standoffs according to one aspect of the present embodiments.

Referring now to FIG. 29, the MEMS wafer 2500 after formation of standoffs is shown according to one aspect of the present embodiments. A photoresist (not shown) is deposited on the sacrificial layer 2817. The photoresist is a mask used to etch the sacrificial layer 2817 and expose the portions of the device silicon wafer 2508 in the standoff pattern 2716. As such, portions of the sacrificial layer 2817 are selectively removed below the standoff pattern 2716, thereby exposing portions of the device silicon wafer 2508 in the standoff pattern 2716.

A layer of standoff material (e.g. tungsten) is deposited on the exposed portions of the device silicon wafer 2508 in the standoff pattern 2716, thereby forming standoffs 2920. In some embodiments, the standoffs 2920 and the sacrificial layer 2817 are planarized (e.g. chemical-mechanical polishing of the surface of the standoffs 2920 and the sacrificial layer 2817).

Figure 30:
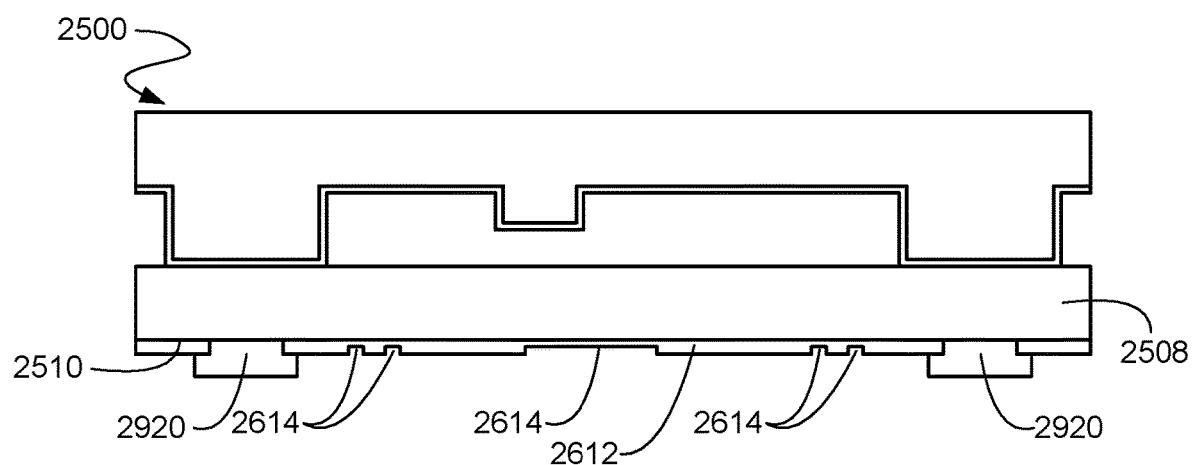
FIG. 30 shows the MEMS wafer after removal of the sacrificial layer according to one aspect of the present embodiments.

Referring now to FIG. 30, the MEMS wafer 2500 after removal of the sacrificial layer 2817 is shown according to one aspect of the present embodiments. The sacrificial layer 2817 is removed (e.g. etched), leaving the standoffs 2920. In addition, the hardmask 2612 including the MEMS device pattern 2614 are exposed and available for further processing.

Figure 31:
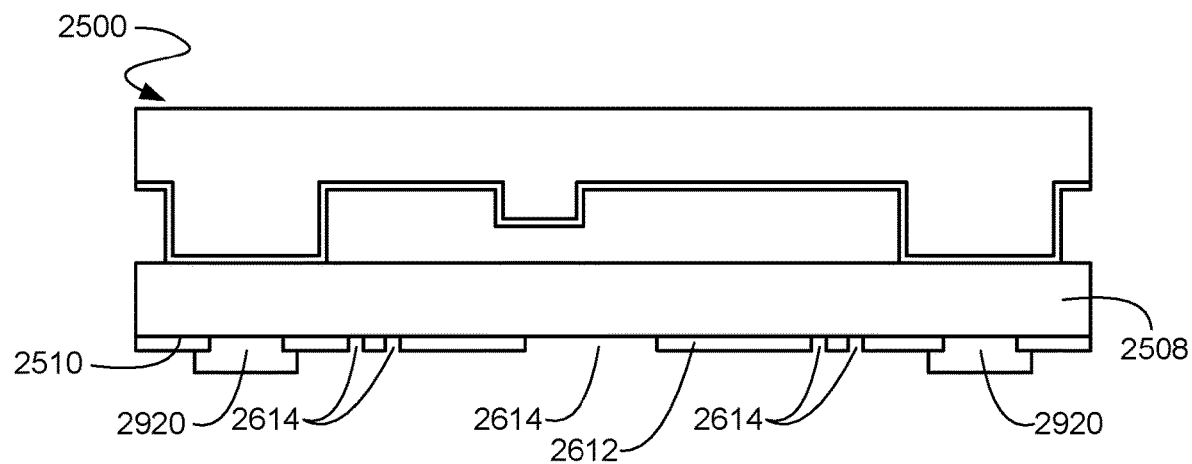
FIG. 31 shows the MEMS wafer after further etching of the MEMS device pattern according to one aspect of the present embodiments.

Referring now to FIG. 31, the MEMS wafer 2500 after further etching of the MEMS device pattern 2614 is shown according to one aspect of the present embodiments. After formation of the standoffs 2920, the MEMS device pattern 2614 is further etched into the hardmask 2612. The further etching of the MEMS device pattern 2614 reaches the device silicon wafer 2508, thereby exposing portions of the device silicon wafer 2508 in the MEMS device pattern 2614.

Figure 32:
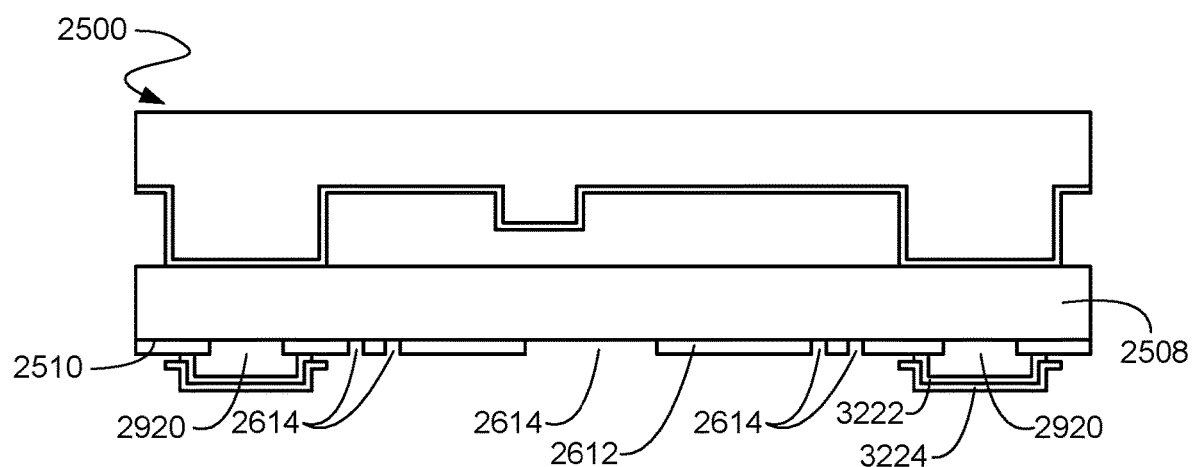
FIG. 32 shows the MEMS wafer after deposition of a eutectic bond metal on the standoffs according to one aspect of the present embodiments.

Referring now to FIG. 32, the MEMS wafer 2500 after deposition of a eutectic bond metal on the standoffs 2920 is shown according to one aspect of the present embodiments. A eutectic bond metal 3222 (e.g. germanium, aluminum, etc.) has been deposited (e.g. sputtered) onto the second side 2510 of the device silicon wafer 2508, including the standoffs 2920, the hardmask 2612, and the exposed portions of the device silicon wafer 2508 in the MEMS device pattern 2614. A photoresist 3224 is deposited on the eutectic bond metal 3222 and then removed, leaving only the photoresist 3224 covering the standoffs 2920 and the eutectic bond metal 3222 on the standoffs 2920. The eutectic bond metal 3222 is then etched using the photoresist 3224. The etching removes the eutectic bond metal 3222 from the hardmask 2612 and the exposed portions of the device silicon wafer 2508 in the MEMS device pattern 2614, leaving the eutectic bond metal 3222 covering the standoffs 2920.

Figure 33:
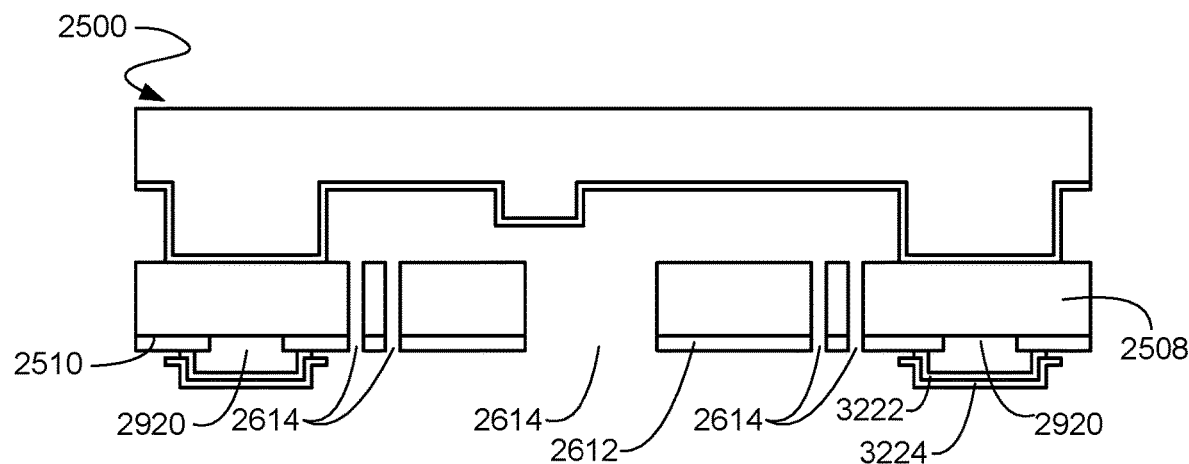
FIG. 33 shows the MEMS wafer after device layer etch according to one aspect of the present embodiments.

Referring now to FIG. 33, the MEMS wafer 2500 after device layer etch is shown according to one aspect of the present embodiments. The MEMS device pattern 2614 (defined by the hardmask 2612) is etched into the device silicon wafer 2508. During the etching the photoresist 3224 protects the eutectic bond metal 3222.

Figure 34:
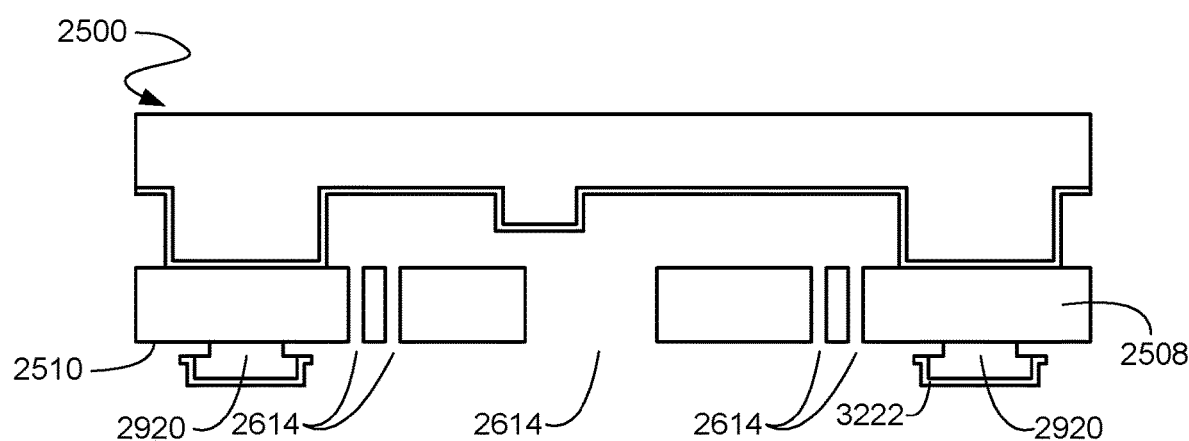
FIG. 34 shows the MEMS wafer ready for bonding with a CMOS wafer according to one aspect of the present embodiments.

Referring now to FIG. 34, the MEMS wafer 2500 ready for bonding with a CMOS wafer is shown according to one aspect of the present embodiments. The photoresist 3224 has been removed (e.g. stripped). In addition, the hardmask 2612 has been removed (e.g. etched), leaving the device silicon wafer 2508 and the standoffs 2920 with the eutectic bond metal 3222. In further steps (not shown), the standoffs 2920 of the MEMS wafer 2500 are eutecticly bonded to a CMOS wafer with eutectic bonds. In various embodiments, the eutectic bond metal 3222 (e.g. germanium) on the standoffs 2920 may form the eutectic bonds with another eutectic bond metal (e.g. aluminum) on the CMOS wafer.

Figure 35:
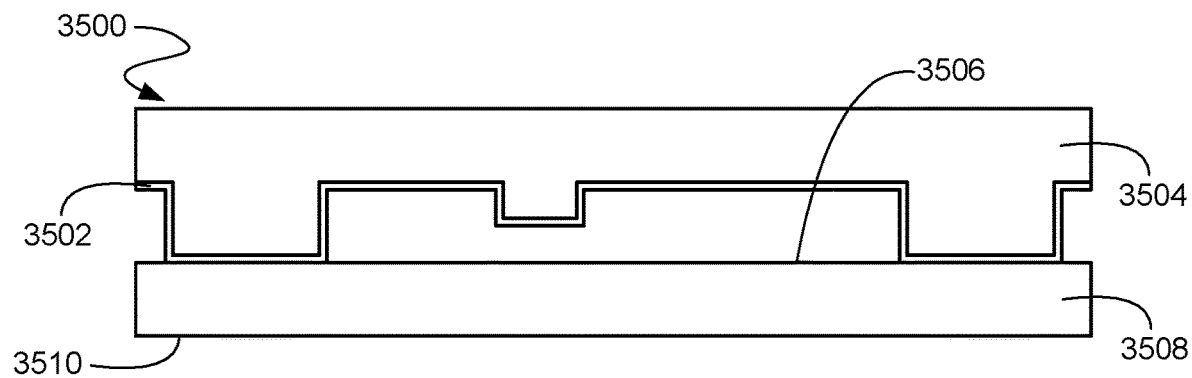
FIG. 35 shows another MEMS wafer at an early stage of manufacture according to one aspect of the present embodiments.

Referring now to FIG. 35, another MEMS wafer 3500 at an early stage of manufacture is shown according to one aspect of the present embodiments. A fusion bond oxide 3502 fusion bonds a handle silicon wafer 3504 to a first side 3506 of a device silicon wafer 3508. A second side 3510 of the device silicon wafer 3508 is planar and opposite the first side 3506.

Figure 36:
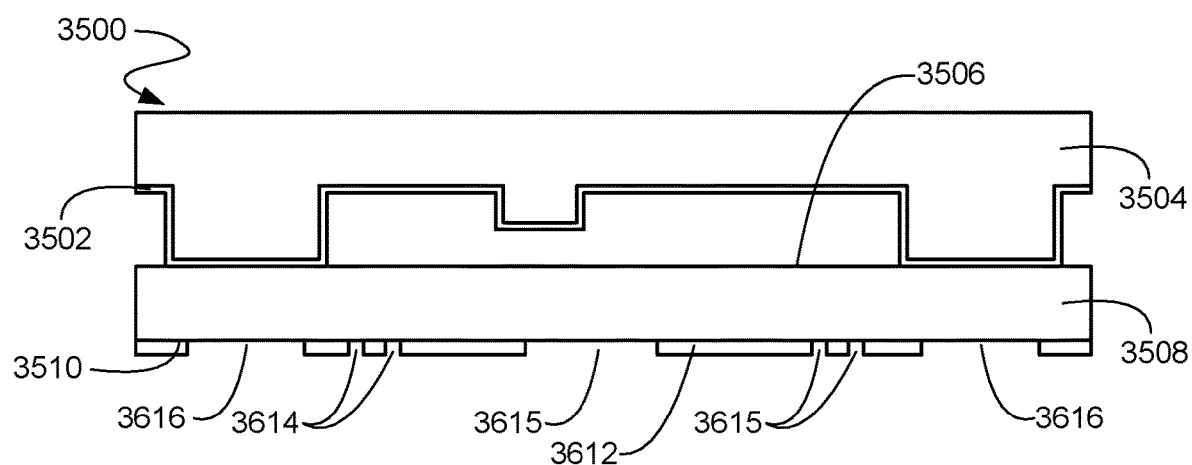
FIG. 36 shows the MEMS wafer after hardmask deposition according to one aspect of the present embodiments.

Referring now to FIG. 36, the MEMS wafer 3500 after hardmask deposition is shown according to one aspect of the present embodiments. A hardmask 3612 is deposited on the second side 3510 of the device silicon wafer 3508. In various embodiments the hardmask 3612 includes oxide and is a different material than the device silicon wafer 3508. The hardmask 3612 is etched to form a MEMS device pattern 3614, a recess pattern 3615, and a standoff pattern 3616. The etching of the MEMS device pattern 3614, the recess pattern 3615, and the standoff pattern 3616 etches the full thickness of the hardmask 3612, thereby exposing portions of the device silicon wafer 3508 in the MEMS device pattern 3614, the recess pattern 3615, and the standoff pattern 3616. As such, the etching of the MEMS device pattern 3614, the recess pattern 3615, and the standoff pattern 3616 into the hardmask 3612 reaches the device silicon wafer 3508.

Figure 37:
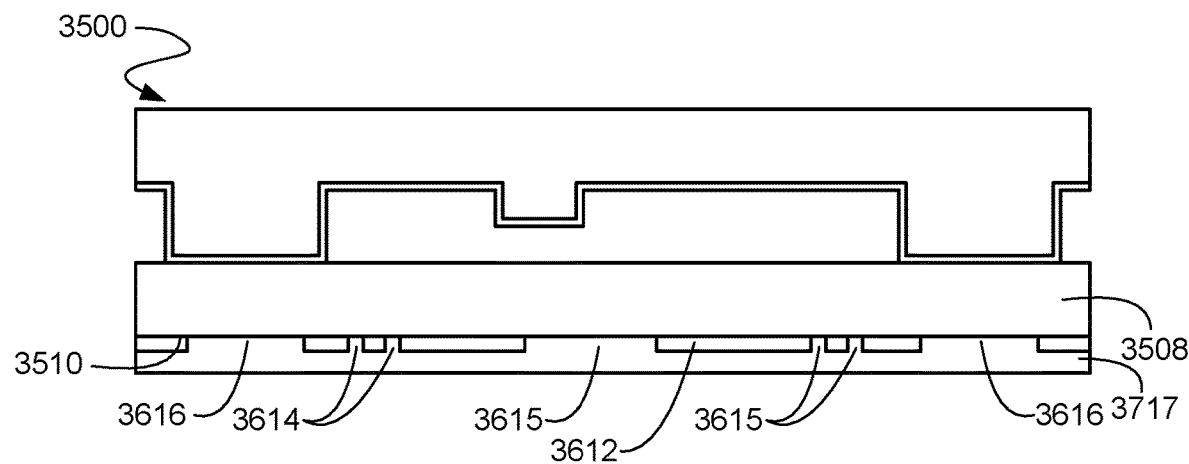
FIG. 37 shows the MEMS wafer after standoff layer deposition according to one aspect of the present embodiments.

Referring now to FIG. 37, the MEMS wafer 3500 after standoff layer deposition is shown according to one aspect of the present embodiments. A standoff layer 3717 is deposited over the hardmask 3612 and the exposed portions of the device silicon wafer 3508. In some embodiments, the standoff layer 3717 is planarized (e.g. chemical-mechanical polishing of the surface of the standoff layer 3717). The standoff layer 3717 may include, for example, poly-silicon, epi-silicon, AlCu, or tungsten.

Figure 38:
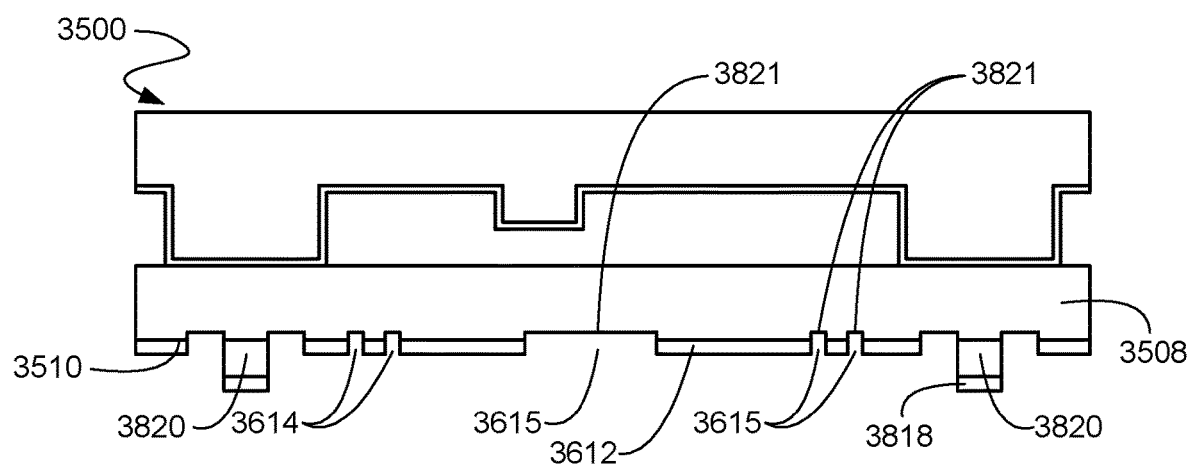
FIG. 38 shows the MEMS wafer after formation of standoffs according to one aspect of the present embodiments.

Referring now to FIG. 38, the MEMS wafer 3500 after formation of standoffs is shown according to one aspect of the present embodiments. A photoresist 3818 is deposited on the standoff layer 3717. The photoresist 3818 is a mask used during etching of the standoff layer 3717. The etching forms standoffs 3820, that are defined by the standoff pattern 3616. The etching also removes some of the exposed portions of the device silicon wafer 3508 in the MEMS device pattern 3614, the recess pattern 3615, and around the standoffs 3820 in the standoff pattern 3616. As such, the etching of the exposed portions of the device silicon wafer 3508 in the recess pattern 3615 forms recesses 3821 in the device wafer, wherein the recesses 3821 are defined by the recess pattern 3615. After etching, the photoresist 3818 is removed.

Figure 39:
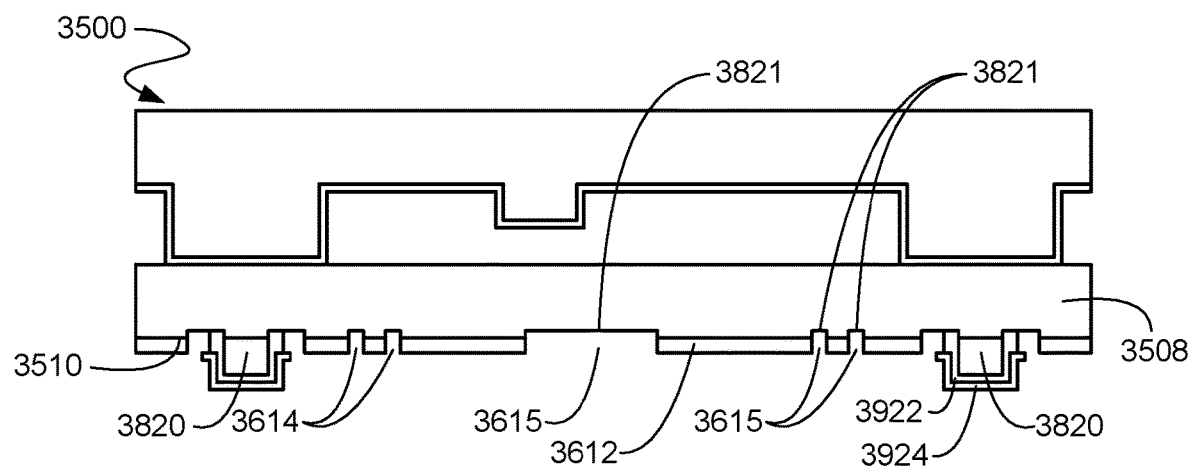
FIG. 39 shows the MEMS wafer after deposition of a eutectic bond metal on the standoffs according to one aspect of the present embodiments.

Referring now to FIG. 39, the MEMS wafer 3500 after deposition of a eutectic bond metal on the standoffs 3820 is shown according to one aspect of the present embodiments. A eutectic bond metal 3922 (e.g. germanium, aluminum, etc.) has been deposited (e.g. sputtered) onto the second side 3510 of the device silicon wafer 3508, including the standoffs 3820, the hardmask 3612, and the exposed portions of the device silicon wafer 3508 in the MEMS device pattern 3614 and recess pattern 3615 (e.g. the recesses 3821). Another photoresist 3924 is deposited on the eutectic bond metal 3922 and then removed, leaving only the photoresist 3924 covering the standoffs 3820 and the eutectic bond metal 3922 on the standoffs 3820. The eutectic bond metal 3922 is then etched using the photoresist 3924. The etching removes the eutectic bond metal 3922 from the hardmask 3612 and the exposed portions of the device silicon wafer 3508 in the MEMS device pattern 3614 and the recess pattern 3615 (e.g. the recesses 3821), leaving the eutectic bond metal 3922 covering the standoffs 3820.

Figure 40:
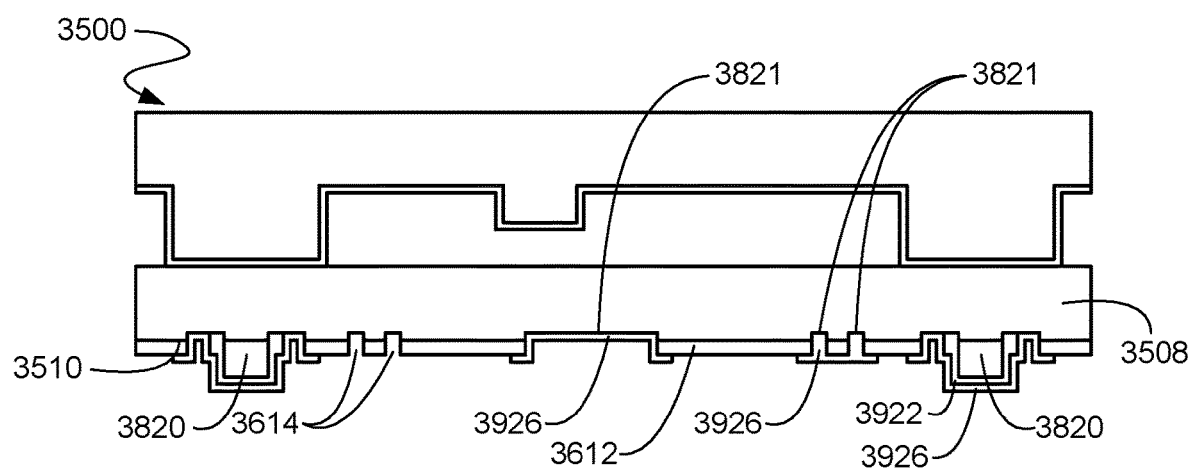
FIG. 40 shows the MEMS wafer after deposition of a further photoresist according to one aspect of the present embodiments.

Referring now to FIG. 40, the MEMS wafer 3500 after deposition of a further photoresist is shown according to one aspect of the present embodiments. The photoresist 3924 is stripped and a further photoresist 3926 is deposited over the standoffs 3820, including the eutectic bond metal 3922 and the exposed areas of the device silicon wafer 3508 around the standoffs 3820. In addition, the photoresist 3926 is deposited on the exposed areas of the device silicon wafer 3508 on the recess pattern 3615 (e.g. the recesses 3821). As such, the areas of the device silicon wafer 3508 in the MEMS device pattern 3614 remain exposed for further processing.

Figure 41:
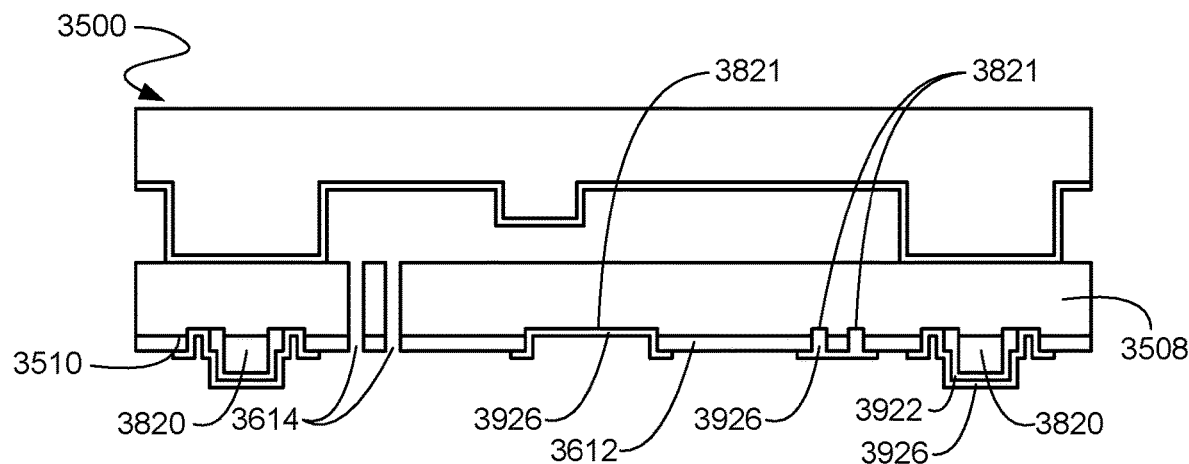
FIG. 41 shows the MEMS wafer after device layer etch according to one aspect of the present embodiments.

Referring now to FIG. 41, the MEMS wafer 3500 after device layer etch is shown according to one aspect of the present embodiments. The MEMS device pattern 3614 (defined by the hardmask 3612) is etched into the device silicon wafer 3508. During the etching the photoresist 3926 protects the eutectic bond metal 3922 and the areas of the device silicon wafer 3508 in the recess pattern 3615 (e.g. the recesses 3821).

Figure 42:
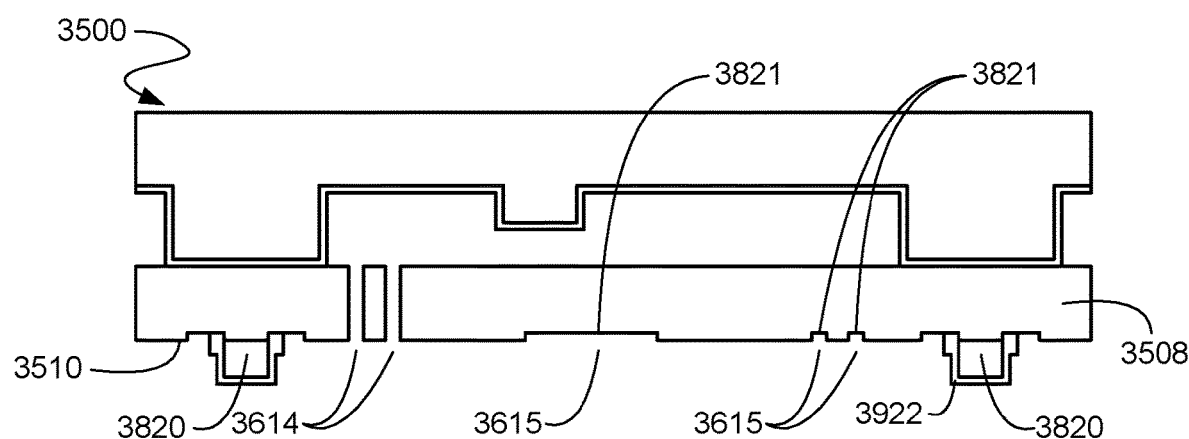
FIG. 42 shows the MEMS wafer ready for bonding with a CMOS wafer according to one aspect of the present embodiments.

Referring now to FIG. 42, the MEMS wafer 3500 ready for bonding with a CMOS wafer is shown according to one aspect of the present embodiments. The photoresist 3926 has been removed (e.g. stripped). In addition, the hardmask 3612 has been removed (e.g. etched), leaving the device silicon wafer 3508, the recesses 3821, and the standoffs 3820 with the eutectic bond metal 3922. In further steps (not shown), the standoffs 3820 of the MEMS wafer 3500 are eutecticly bonded to a CMOS wafer with eutectic bonds. In various embodiments, the eutectic bond metal 3922 (e.g. germanium) on the standoffs 3820 may form the eutectic bonds with another eutectic bond metal (e.g. aluminum) on the CMOS wafer. The recesses 3821 can increase the vertical gap between the proof mass and the electrode in the CMOS wafer. In addition, the recesses 3821 can reduce the contact area between the proof mass and the bump stop in the CMOS wafer.

Figure 43:
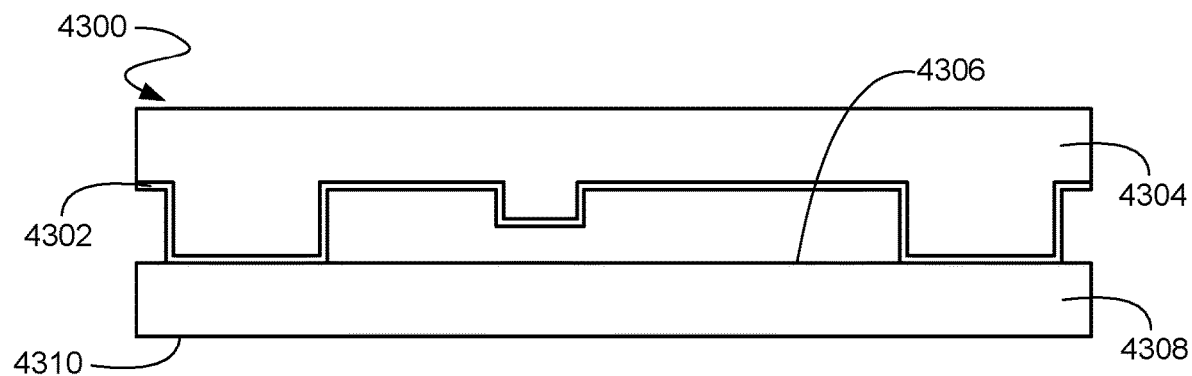
FIG. 43 shows another MEMS wafer at an early stage of manufacture according to one aspect of the present embodiments.

Referring now to FIG. 43, another MEMS wafer 4300 at an early stage of manufacture is shown according to one aspect of the present embodiments. A fusion bond oxide 4302 fusion bonds a handle silicon wafer 4304 to a first side 4306 of a device silicon wafer 4308. A second side 4310 of the device silicon wafer 4308 is planar and opposite the first side 4306.

Figure 44:
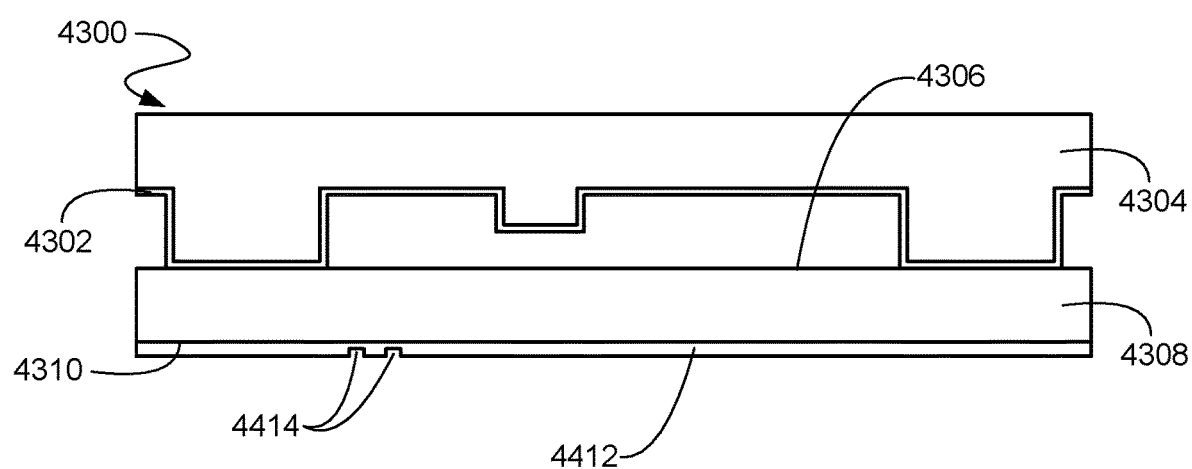
FIG. 44 shows the MEMS wafer after hardmask deposition according to one aspect of the present embodiments.

Referring now to FIG. 44, the MEMS wafer 4300 after hardmask deposition is shown according to one aspect of the present embodiments. A hardmask 4412 is deposited on the second side 4310 of the device silicon wafer 4308. In various embodiments the hardmask 4412 includes oxide and is a different material than the device silicon wafer 4308. The hardmask 4412 is etched to form a MEMS device pattern 4414. The etching of the hardmask 4412 etches a partial thickness of the hardmask 4412. As such, the etching stops before reaching the device silicon wafer 4308, thereby leaving the second side 4310 of the device silicon wafer 4308 covered by the hardmask 4412.

Figure 45:
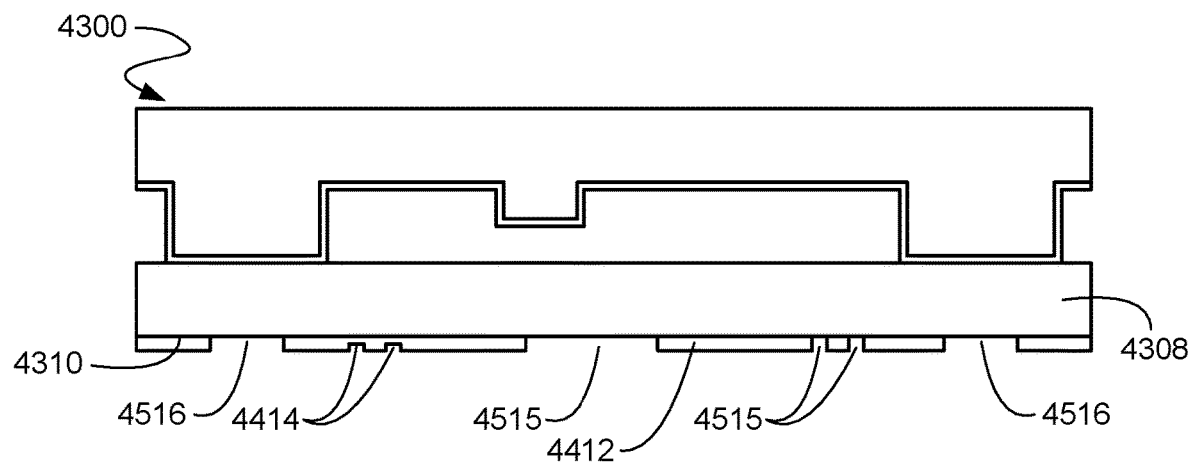
FIG. 45 shows the MEMS wafer after formation of a standoff pattern and a recess pattern according to one aspect of the present embodiments.

Referring now to FIG. 45, the MEMS wafer 4300 after formation of a standoff pattern and a recess pattern is shown according to one aspect of the present embodiments. The hardmask 4412 is etched to form a standoff pattern 4516 and a recess pattern 4515. The etching of the standoff pattern 4516 and the recess pattern 4515 into the hardmask 4412 etches the full thickness of the hardmask 4412, thereby exposing portions of the device silicon wafer 4308 in the standoff pattern 4516. As such, the etching of the standoff pattern 4516 and the recess pattern 4515 reaches the device silicon wafer 4308. On the other hand, the MEMS device pattern 4414 remains partially etched at this point, and the portions of the device silicon wafer 4308 in the MEMS device pattern 4414 remain covered by the hardmask 4412.

Figure 46:
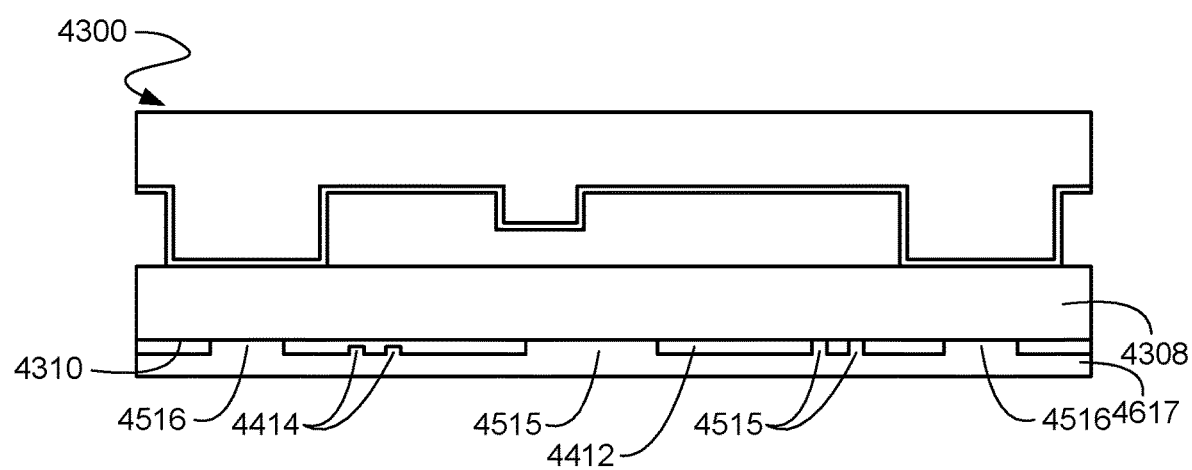
FIG. 46 shows the MEMS wafer after standoff layer deposition according to one aspect of the present embodiments.

Referring now to FIG. 46, the MEMS wafer 4300 after standoff layer deposition is shown according to one aspect of the present embodiments. A standoff layer 4617 is deposited over the hardmask 4412 and the exposed portions of the device silicon wafer 4308. In some embodiments, the standoff layer 4617 is planarized (e.g. chemical-mechanical polishing of the surface of the standoff layer 4617). The standoff layer 4617 may include, for example, poly-silicon, epi-silicon, AlCu, or tungsten.

Figure 47:
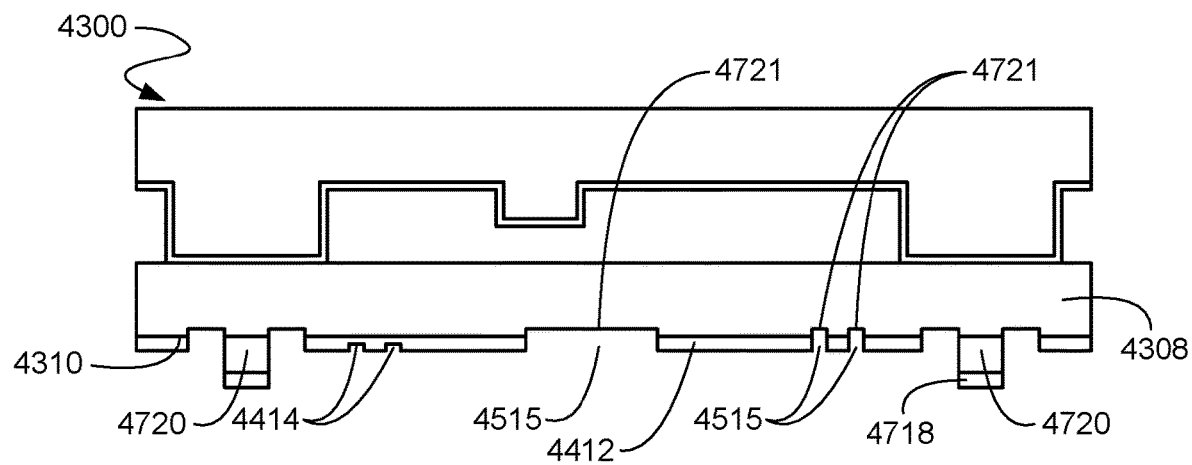
FIG. 47 shows the MEMS wafer after formation of standoffs according to one aspect of the present embodiments.

Referring now to FIG. 47, the MEMS wafer 4300 after formation of standoffs is shown according to one aspect of the present embodiments. A photoresist 4718 is deposited on the standoff layer 4617. The photoresist 4718 is a mask used during etching of the standoff layer 4617. The etching forms standoffs 4720, that are defined by the standoff pattern 4516. The etching also removes some of the exposed portions of the device silicon wafer 4308 in the recess pattern 4515 and around the standoffs 4720 in the standoff pattern 4516. As such, the etching of the exposed portions of the device silicon wafer 4308 in the recess pattern 4515 forms recesses 4721 in the device wafer, wherein the recesses 4721 are defined by the recess pattern 4515. However, the portions of the device silicon wafer 4308 in the MEMS device pattern 4414 that remain covered by the hardmask 4412 are protected from the etch, and do not suffer from etch-loss.

Figure 48:
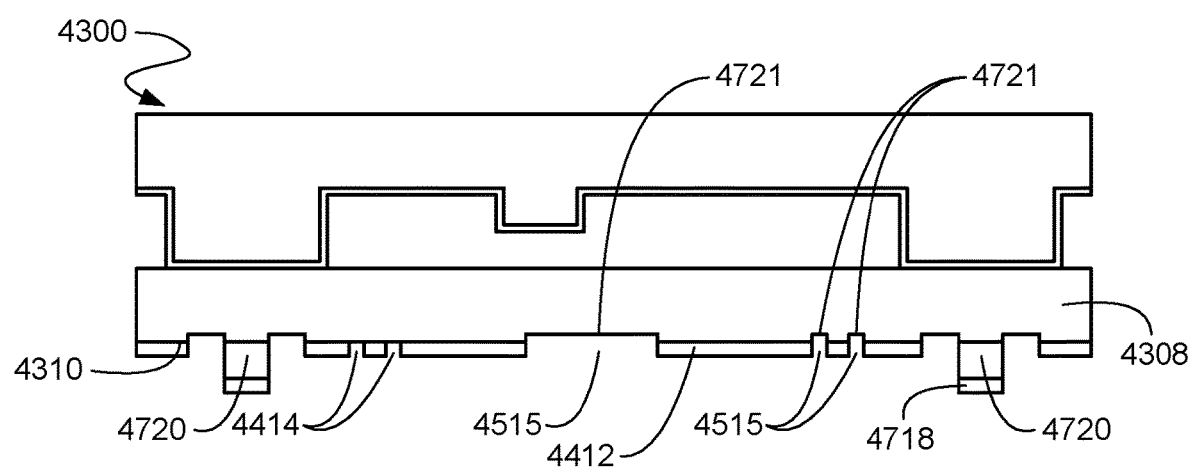
FIG. 48 shows the MEMS wafer after further etching of the MEMS device pattern according to one aspect of the present embodiments.

Referring now to FIG. 48, the MEMS wafer 4300 after further etching of the MEMS device pattern 4414 is shown according to one aspect of the present embodiments. After formation of the standoffs 4720, the MEMS device pattern 4414 is further etched into the hardmask 4412. The further etching of the MEMS device pattern 4414 reaches the device silicon wafer 4308, thereby exposing portions of the device silicon wafer 4308 in the MEMS device pattern 4414. After etching, the photoresist 4718 is removed.

Figure 49:
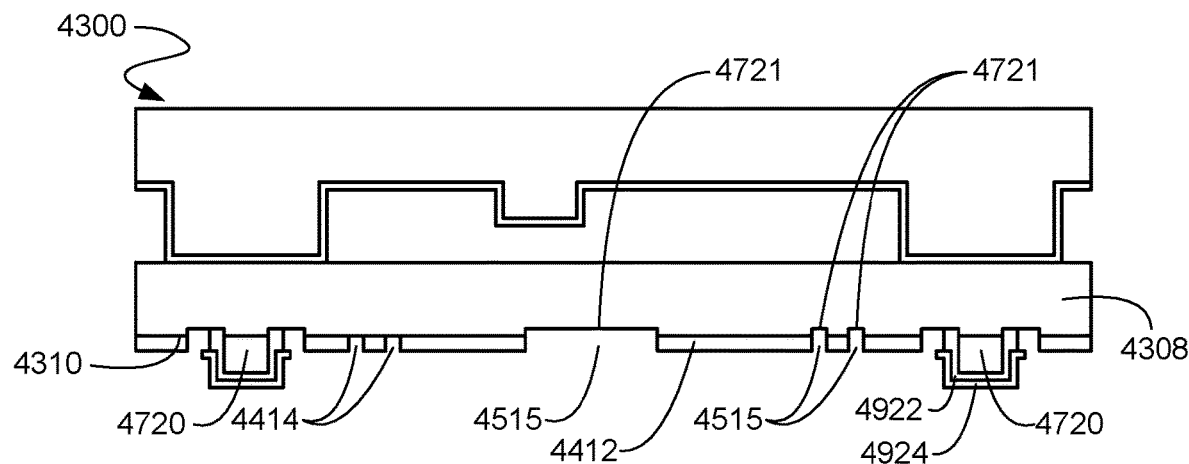
FIG. 49 shows the MEMS wafer after deposition of a eutectic bond metal on the standoffs according to one aspect of the present embodiments.

Referring now to FIG. 49, the MEMS wafer 4300 after deposition of a eutectic bond metal on the standoffs 4720 is shown according to one aspect of the present embodiments. A eutectic bond metal 4922 (e.g. germanium, aluminum, etc.) has been deposited (e.g. sputtered) onto the second side 4310 of the device silicon wafer 4308, including the standoffs 4720, the hardmask 4412, and the exposed portions of the device silicon wafer 4308 in the MEMS device pattern 4414 and recess pattern 4515 (e.g. the recesses 4721). Another photoresist 4924 is deposited on the eutectic bond metal 4922 and then removed, leaving only the photoresist 4924 covering the standoffs 4720 and the eutectic bond metal 4922 on the standoffs 4720. The eutectic bond metal 4922 is then etched using the photoresist 4924. The etching removes the eutectic bond metal 4922 from the hardmask 4412 and the exposed portions of the device silicon wafer 4308 in the MEMS device pattern 4414 and the recess pattern 4515 (e.g. the recesses 4721), leaving the eutectic bond metal 4922 covering the standoffs 4720.

Figure 50:
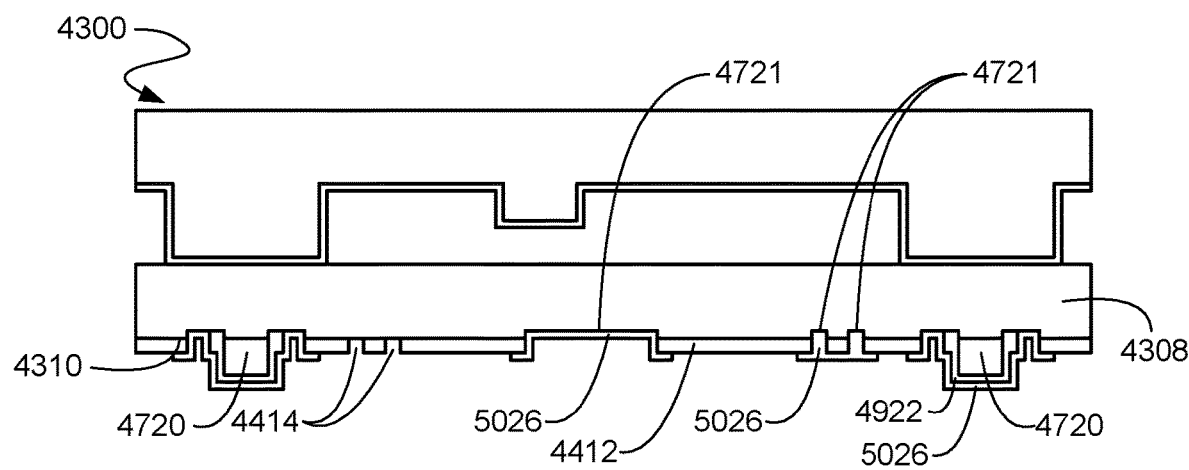
FIG. 50 shows the MEMS wafer after deposition of a further photoresist according to one aspect of the present embodiments.

Referring now to FIG. 50, the MEMS wafer 4300 after deposition of a further photoresist is shown according to one aspect of the present embodiments. The photoresist 4924 is stripped and a further photoresist 5026 is deposited over the standoffs 4720, including the eutectic bond metal 4922 and the exposed areas of the device silicon wafer 4308 around the standoffs 4720. In addition, the photoresist 5026 is deposited on the exposed areas of the device silicon wafer 4308 on the recess pattern 4515 (e.g. the recesses 4721). As such, the areas of the device silicon wafer 4308 in the MEMS device pattern 4414 remain exposed for further processing.

Figure 51:
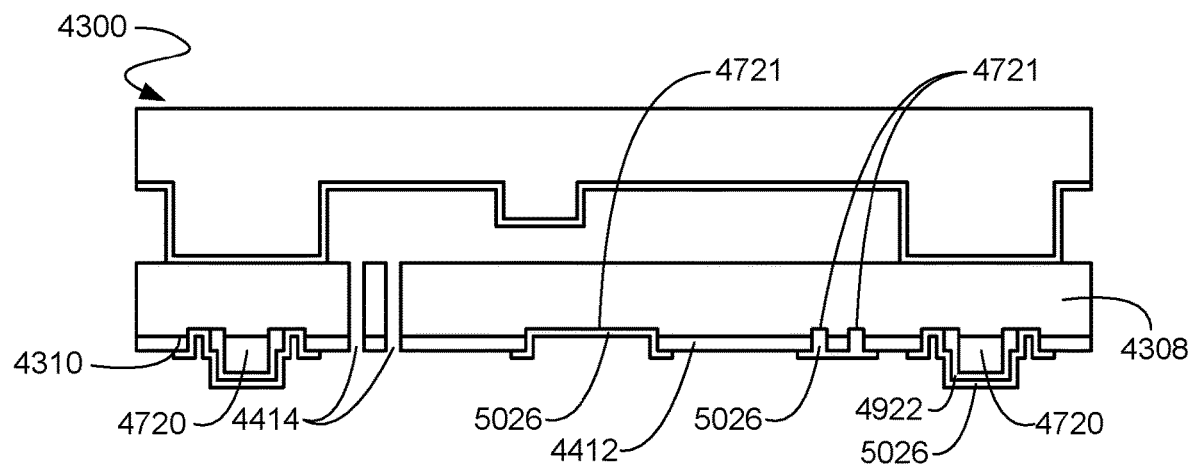
FIG. 51 shows the MEMS wafer after device layer etch according to one aspect of the present embodiments.

Referring now to FIG. 51, the MEMS wafer 4300 after device layer etch is shown according to one aspect of the present embodiments. The MEMS device pattern 4414 (defined by the hardmask 4412) is etched into the device silicon wafer 4308. During the etching the photoresist 5026 protects the eutectic bond metal 4922 and the areas of the device silicon wafer 4308 in the recess pattern 4515 (e.g. the recesses 4721).

Figure 52:
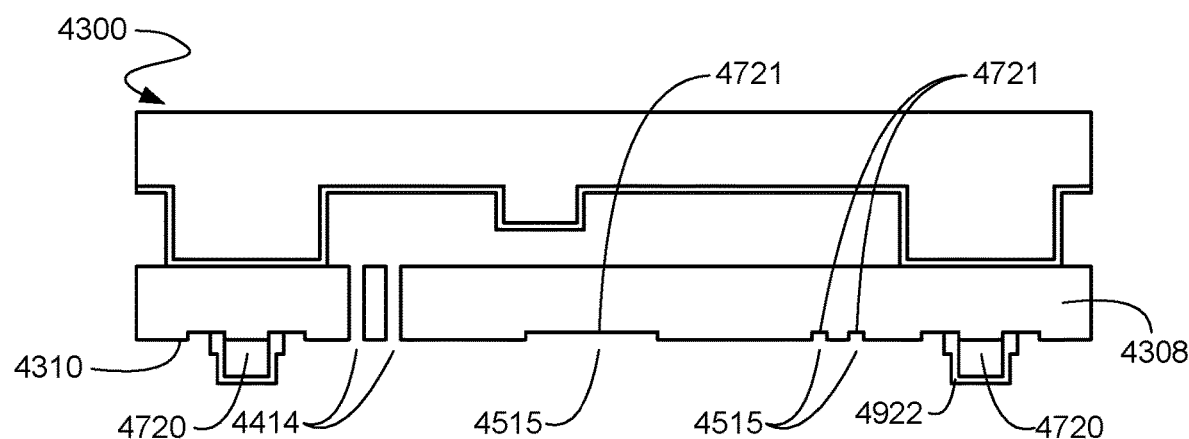
FIG. 52 shows the MEMS wafer 4300 ready for bonding with a CMOS wafer according to one aspect of the present embodiments.

Referring now to FIG. 52, the MEMS wafer 4300 ready for bonding with a CMOS wafer is shown according to one aspect of the present embodiments. The photoresist 5026 has been removed (e.g. stripped). In addition, the hardmask 4412 has been removed (e.g. etched), leaving the device silicon wafer 4308, the recesses 4721, and the standoffs 4720 with the eutectic bond metal 4922. In further steps (not shown), the standoffs 4720 of the MEMS wafer 4300 are eutecticly bonded to a CMOS wafer with eutectic bonds. In various embodiments, the eutectic bond metal 4922 (e.g. germanium) on the standoffs 4720 may form the eutectic bonds with another eutectic bond metal (e.g. aluminum) on the CMOS wafer. The recesses 4721 can increase the vertical gap between the proof mass and the electrode in the CMOS wafer. In addition, the recesses 4721 can reduce the contact area between the proof mass and the bump stop in the CMOS wafer.

FIG. 53 shows an exemplary flow diagram for actuator layer patterning with topography according to one aspect of the present embodiments. At block 5302, a handle wafer is fusion bonded to a first side of a device wafer. At block 5304, a hardmask is deposited on a second side of the device wafer, wherein the second side is planar. At a block 5306, the hardmask is etched to form a MEMS device pattern and a standoff pattern. At a block 5308, standoffs are formed on the device wafer, wherein the standoffs are defined by the standoff pattern. At a block 5310, a eutectic bond metal is deposited on the standoffs, the device wafer, and the hardmask. At a block 5312, a first photoresist is deposited and the first photoresist is removed such that the first photoresist covers the standoffs. At a block 5314, the eutectic bond metal is etched using the first photoresist. At a block 5316, the MEMS device pattern is etched into the device wafer. At a block 5318, the first photoresist is removed and the hardmask is removed.

FIGS. 54A and 54B show another exemplary flow diagram for actuator layer patterning with topography according to one aspect of the present embodiments. At block 5402, a handle wafer is fusion bonded to a first side of a device wafer. At a block 5404, a hardmask is deposited on a second side of the device wafer, wherein the second side is planar. At a block 5406, the hardmask is etched to form a MEMS device pattern, a standoff pattern, and a recess pattern. At a block 5408, standoffs are formed on the device wafer, wherein the standoffs are defined by the standoff pattern. At a block 5410, recesses are formed in the device wafer, wherein the recesses are defined by the recess pattern. At a block 5412, a eutectic bond metal is deposited on the device wafer, the standoffs and the hardmask. At a block 5414, a first photoresist is deposited and the first photoresist is removed such that the photoresist covers the standoffs. At a block 5416, the eutectic bond metal is etched using the first photoresist and the first photoresist is removed. At a block 5418, a second photoresist is deposited and removed such that the second photoresist covers the standoffs, the eutectic bond metal, and the recess pattern. At a block 5420, the MEMS device pattern is etched into the device wafer. At a block 5422, the second photoresist is removed. At a block 5424, the hardmask is removed.

While the embodiments have been described and/or illustrated by means of particular examples, and while these embodiments and/or examples have been described in considerable detail, it is not the intention of the Applicants to restrict or in any way limit the scope of the embodiments to such detail. Additional adaptations and/or modifications of the embodiments may readily appear, and, in its broader aspects, the embodiments may encompass these adaptations and/or modifications. Accordingly, departures may be made from the foregoing embodiments and/or examples without departing from the scope of the concepts described herein. The implementations described above and other implementations are within the scope of the following claims.

What is claimed is:

1. A method comprising:
    fusion bonding a handle wafer to a first side of a device wafer;
    depositing a hardmask on a second side of the device wafer, wherein the second side is planar;
    etching the hardmask to form a micro-electro-mechanical system ("MEMS") device pattern and a standoff pattern;
    forming standoffs on the device wafer, wherein the standoffs are defined by the standoff pattern;
    depositing a eutectic bond metal on the standoffs, the device wafer, and the hardmask;
    depositing a first photoresist and removing the first photoresist such that the first photoresist covers the standoffs;
    etching the eutectic bond metal using the first photoresist;
    etching the MEMS device pattern into the device wafer; and
    removing the first photoresist and removing the hardmask.

2. The method of claim 1, wherein forming the standoffs on the device wafer includes:
    depositing a standoff layer on the hardmask and the device wafer; and
    etching the standoff layer to form the standoffs.

3. The method of claim 2, further comprising planarizing a surface of the standoff layer before the etching the standoff layer.

4. The method of claim 1, wherein etching the hardmask to form the MEMS device pattern and the standoff pattern includes:
   etching the MEMS device pattern into the hardmask, wherein the etching the MEMS device pattern stops before reaching the device wafer; and
   etching the standoff pattern into the hardmask, wherein the etching the standoff pattern reaches the device wafer.

5. The method of claim 4, further comprising further etching the MEMS device pattern into the hardmask after the forming the standoffs, wherein the further etching reaches the device wafer.

6. The method of claim 1 wherein forming the standoffs on the device wafer includes growing the standoffs on the device wafer in the standoff pattern.

7. The method of claim 1, wherein forming the standoffs on the device wafer includes:
   depositing a sacrificial layer on the hardmask and the device wafer;
   selectively removing portions of the sacrificial layer below the standoff pattern and exposing portions of the device wafer in the standoff pattern; and
   depositing a standoff layer on the exposed portions of the device wafer to form the standoffs.

8. The method of claim 1, wherein the hardmask includes oxide.

9. The method of claim 1, wherein the standoffs include poly-silicon, epi-silicon, AlCu, or tungsten.

10. The method of claim 1, further comprising eutecticly bonding the standoffs to a complementary metal-oxide semiconductor ("CMOS") wafer.

11. A method comprising:
   fusion bonding a handle wafer to a first side of a device wafer;
   depositing a hardmask on a second side of the device wafer, wherein the second side is planar;
   etching the hardmask to form a micro-electro-mechanical system ("MEMS") device pattern, a standoff pattern, and a recess pattern;
   forming standoffs on the device wafer, wherein the standoffs are defined by the standoff pattern;
   forming recesses in the device wafer, wherein the recesses are defined by the recess pattern;
   depositing a eutectic bond metal on the device wafer, the standoffs and the hardmask;
   depositing a first photoresist and removing the first photoresist such that the photoresist covers the standoffs;
   etching the eutectic bond metal using the first photoresist and removing the first photoresist;
   depositing a second photoresist and removing the second photoresist such that the second photoresist covers the standoffs, the eutectic bond metal, and the recess pattern;
   etching the MEMS device pattern into the device wafer;
   removing the second photoresist; and
   removing the hardmask.

12. The method of claim 11, wherein etching the hardmask to form the MEMS device pattern, the standoff pattern, and the recess pattern includes:
   etching the MEMS device pattern into the hardmask, wherein the etching the MEMS device pattern stops before reaching the device wafer;
   etching the standoff pattern into the hardmask, wherein the etching the standoff pattern reaches the device wafer; and
   etching the recess pattern into the hardmask, wherein the etching the recess pattern reaches the device wafer.

13. The method of claim 12, further comprising further etching the MEMS device pattern into the hardmask after the forming the standoffs, wherein the further etching reaches the device wafer.

14. The method of claim 11, wherein forming the standoffs on the device wafer includes:
   depositing a standoff layer on the hardmask and the device wafer; and
   etching the standoff layer to form the standoffs.

15. The method of claim 11, further comprising planarizing a surface of the standoff layer before the etching the standoff layer.

16. The method of claim 11 wherein forming the standoffs on the device wafer includes growing the standoffs on the device wafer in the standoff pattern.

17. The method of claim 11, wherein forming the standoffs on the device wafer includes:
   depositing a sacrificial layer on the hardmask and the device wafer;
   selectively removing portions of the sacrificial layer below the standoff pattern to expose portions of the device wafer in the standoff pattern; and
   depositing a standoff layer on the exposed portions of the device wafer to form the standoffs.

18. The method of claim 11, wherein the hardmask includes oxide.

19. The method of claim 11, wherein the standoffs include poly-silicon, epi-silicon, AlCu, or tungsten.

20. The method of claim 11, further comprising eutecticly bonding the standoffs to a complementary metal-oxide semiconductor ("CMOS") wafer.

* * * * *